(12) United States Patent
Minami

(10) Patent No.: US 11,041,602 B2
(45) Date of Patent: Jun. 22, 2021

(54) OPTICAL SYSTEM AND LIGHT SOURCE DEVICE

(71) Applicant: Panasonic Intellectual Property Management Co., Ltd., Osaka (JP)

(72) Inventor: Kazuhiro Minami, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/357,963

(22) Filed: Mar. 19, 2019

(65) Prior Publication Data

US 2019/0211994 A1 Jul. 11, 2019

Related U.S. Application Data

(63) Continuation of application No. PCT/JP2017/011126, filed on Mar. 21, 2017.

(30) Foreign Application Priority Data

Nov. 30, 2016 (JP) .............................. JP2016-233064

(51) Int. Cl.
*F21V 5/00* (2018.01)
*F21V 5/04* (2006.01)
(Continued)

(52) U.S. Cl.
CPC .............. *F21V 5/007* (2013.01); *F21V 5/04* (2013.01); *F21V 17/162* (2013.01); *G02B 7/02* (2013.01);
(Continued)

(58) Field of Classification Search
None
See application file for complete search history.

(56) References Cited

U.S. PATENT DOCUMENTS

2004/0008744 A1* 1/2004 Okazaki ................ H01S 5/4031
372/36
2005/0201109 A1* 9/2005 Shimura .................. G02B 3/08
362/382
(Continued)

FOREIGN PATENT DOCUMENTS

EP 3096170 11/2016
JP 2004-096088 3/2004
(Continued)

OTHER PUBLICATIONS

International Search Report of PCT application No. PCT/JP2017/011126 dated Jun. 6, 2017.

*Primary Examiner* — William J Carter
(74) *Attorney, Agent, or Firm* — Wenderoth, Lind & Ponack, L.L.P.

(57) ABSTRACT

An optical system includes a plurality of lenses and a lens holding member. Each of the plurality of lenses has a cut-off face to have a shape of a partial circle formed by cutting off part of a periphery of a first circle. Cut-off faces of adjacent lenses face each other. The adjacent lenses have an interval between centers of the lenses is smaller than a diameter of the first circle. The lens holding member has an outer surface including a plurality of lens arrangement holes in which the plurality of lenses are respectively disposed. Adjacent lens arrangement holes are linked together to form a linked hole. The linked hole has a shape that represents part of a shape formed by disposing a plurality of second circles, the second circles being partially overlapped, each of the second circles having a diameter larger than a diameter of the first circle.

13 Claims, 27 Drawing Sheets

(51) Int. Cl.
    *F21V 17/16*     (2006.01)
    *H01S 5/024*     (2006.01)
    *G02B 7/02*     (2021.01)
    *H01S 5/02*     (2006.01)
    *F21Y 105/10*     (2016.01)
    *F21Y 115/30*     (2016.01)
    *H01S 5/40*     (2006.01)
    *H01S 5/02212*     (2021.01)
    *H01S 5/02253*     (2021.01)

(52) U.S. Cl.
    CPC ............ H01S 5/02 (2013.01); H01S 5/02407 (2013.01); *F21Y 2105/10* (2016.08); *F21Y 2115/30* (2016.08); *H01S 5/02212* (2013.01); *H01S 5/02253* (2021.01); *H01S 5/4093* (2013.01)

(56) References Cited

U.S. PATENT DOCUMENTS

| | | | |
|---|---|---|---|
| 2008/0112165 A1* | 5/2008 | Mori | F21V 5/007 |
| | | | 362/241 |
| 2009/0323332 A1* | 12/2009 | Lo | F21V 5/04 |
| | | | 362/235 |
| 2010/0328633 A1 | 12/2010 | Sato et al. | |
| 2012/0162614 A1 | 6/2012 | Kobayashi et al. | |
| 2016/0186958 A1 | 6/2016 | Nagahara et al. | |
| 2016/0341395 A1* | 11/2016 | Kiyota | F21V 5/04 |
| 2017/0016586 A1* | 1/2017 | Tsuda | F21S 41/321 |

FOREIGN PATENT DOCUMENTS

| | | |
|---|---|---|
| JP | 4711155 B | 6/2011 |
| JP | 2012-141411 | 7/2012 |
| JP | 2013-138086 | 7/2013 |
| JP | 5333472 B | 11/2013 |
| JP | 2016-051902 | 4/2016 |
| JP | 2016-127022 | 7/2016 |

* cited by examiner

Column direction

OPTICAL SYSTEM AND LIGHT SOURCE DEVICE

BACKGROUND

1. Technical Field

The present disclosure relates to an optical system including multiple lenses that converge light emitted from respective multiple light sources and to a light source device including the optical system.

2. Description of the Related Art

Japanese Patent Unexamined Publication No. 2016-51902 discloses a holding member that holds multiple semiconductor light light-emitting devices.

SUMMARY

An optical system of the present invention includes a plurality of lenses each of which converges light emitted from a corresponding one of a plurality of light sources, and a lens holding member holding the plurality of lenses. The plurality of lenses are disposed at least in a first direction. Optical axes of the plurality of lenses are substantially parallel to one another. Each of the plurality of lenses has a cut-off face such that each of the plurality of lenses, as viewed from the top, has a shape of a partial circle formed by cutting off part of a periphery of a first circle. Cut-off faces of lenses adjacent to each other in the first direction among the plurality of lenses face each other. The lenses adjacent to each other in the first direction among the plurality of lenses have an interval between centers of the lenses that is smaller than a diameter of the first circle. The lens holding member has an outer surface including a plurality of lens arrangement holes in each of which a corresponding one of the plurality of lenses is disposed. Lens arrangement holes adjacent to each other in the first direction among the plurality of lens arrangement holes are linked together to form a linked hole. The linked hole, as viewed from the top, has a shape that represents at least part of a shape formed by disposing a plurality of second circles in the first direction, the second circles being partially overlapped, each of the second circles having a diameter larger than a diameter of the first circle by a predetermined minute amount.

A light source device of the present disclosure includes the optical system, and the multiple light sources each of which emits the light to a corresponding lens among the multiple lenses.

DESCRIPTION OF EMBODIMENTS

Hereinafter, a detailed description is made of some embodiments with reference to related drawings as appropriate. However, a detailed description more than necessary may be omitted, such as a description of a well-known item and a duplicate description for a substantially identical component, to avoid an unnecessarily redundant description and to allow those skilled in the art to easily understand the following description.

Note that the accompanying drawings and the following description are provided for those skilled in the art to well understand the disclosure, and it is not intended that the drawings and the description limit the subjects described in the claims.

First Exemplary Embodiment

Hereinafter, the first exemplary embodiment is described in reference to some drawings.

Figure 1:
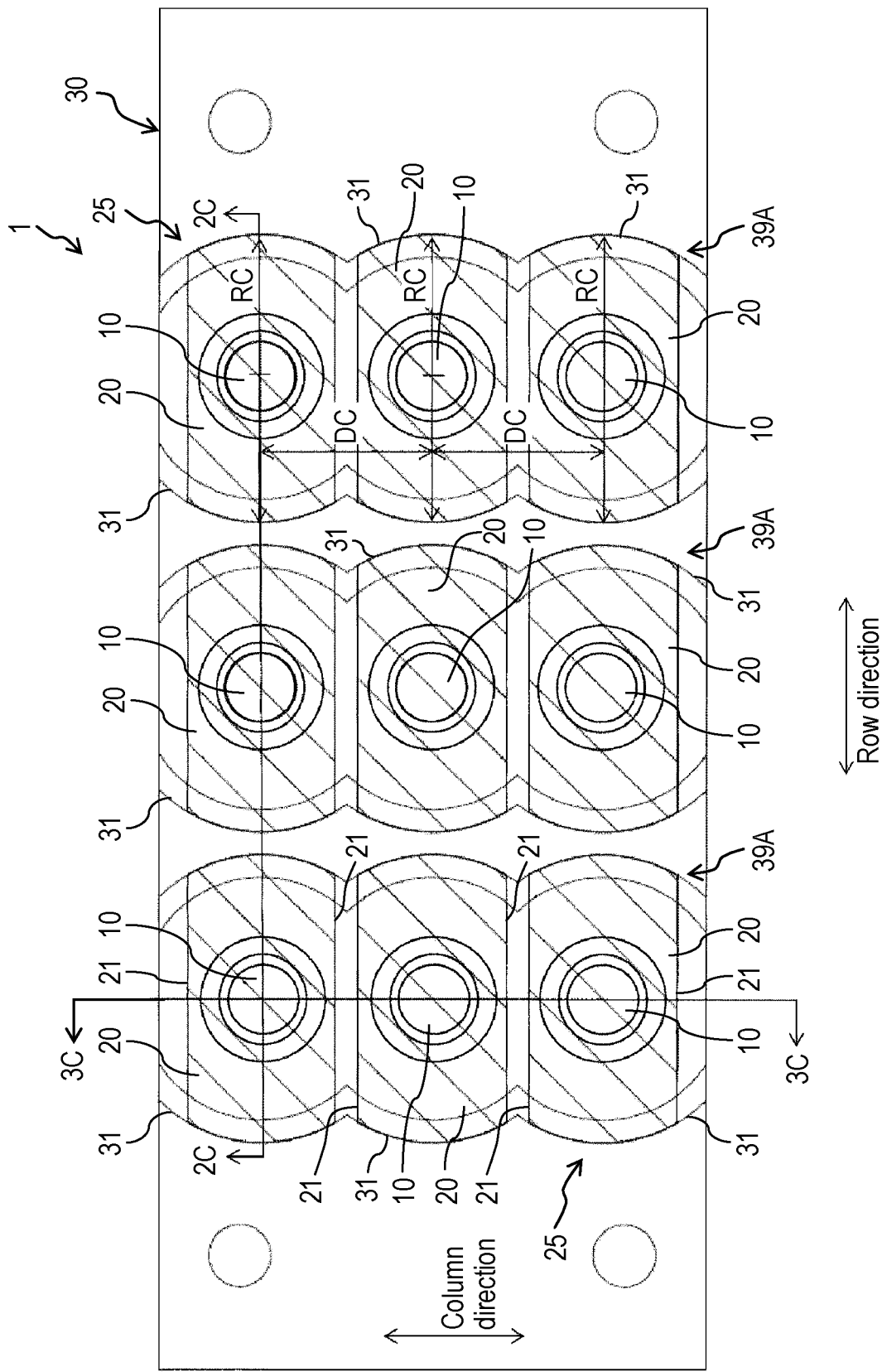
FIG. 1 is an external view of the planar shape of a light source device according to the first exemplary embodiment.
Figure 2:
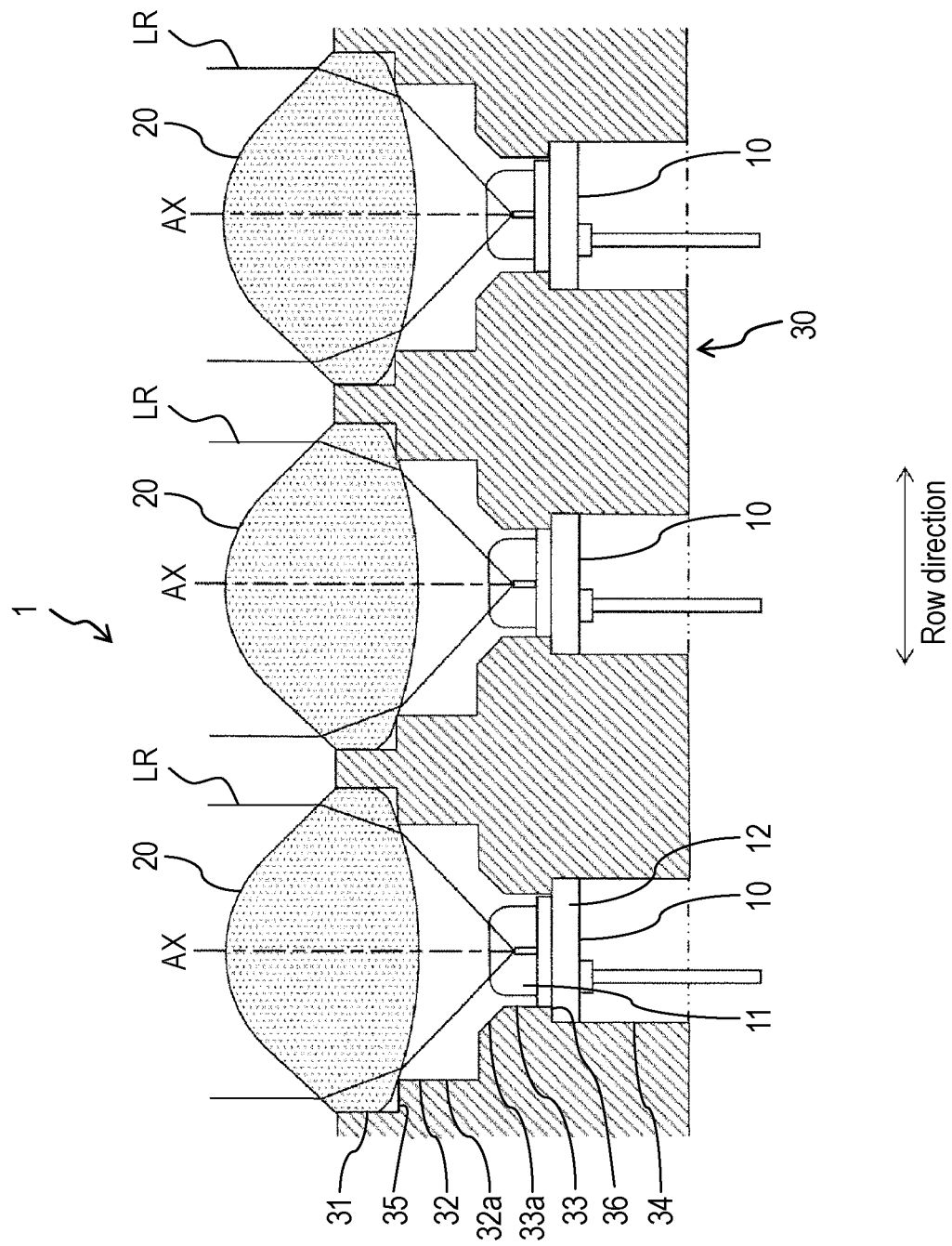
FIG. 2 is a sectional view of the light source device of FIG. 1, taken along line 2C-2C.
Figure 3:
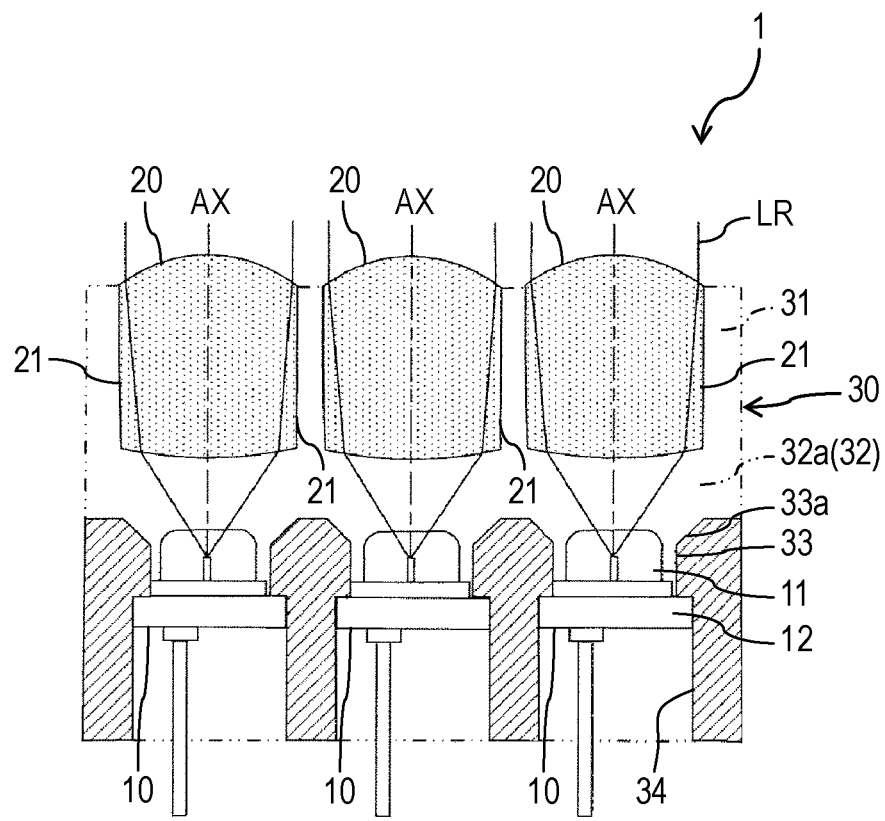
FIG. 3 is a sectional view of the light source device of FIG. 1, taken along line 3C-3C.

FIG. 1 is an external view of the planar shape of a light source device according to the first exemplary embodiment. FIG. 2 is a sectional view of the light source device of FIG. 1, taken along line 2C-2C. FIG. 3 is a sectional view of the light source device of FIG. 1, taken along line 3C-3C. As shown in FIGS. 1 to 3, light source device 1 includes multiple semiconductor laser devices (light sources) 10; and an optical system having multiple collimate lenses 20 and lens holding member 30. Here, collimate lenses 20 in FIG. 1 are hatched as appropriate for easy viewability.

Semiconductor laser device 10 emits laser rays. Semiconductor laser device 10 emits visible light (e.g., red, blue, green) or infrared light. As shown in FIG. 2, semiconductor laser device 10 includes base 12 and light-emitting element 11. Multiple semiconductor laser devices 10 are arranged in the row direction and in the column direction (the first direction) on the same plane, namely in a matrix.

Each of multiple collimate lenses 20 collimates (changes to parallel light) a laser ray emitted from each of semiconductor laser devices 10. These collimate lenses 20 are arranged in the row direction and in the column direction (the first direction) on the same plane.

Lens holding member 30 holds these collimate lenses 20 so as to be arranged in a matrix. Also, lens holding member 30 holds collimate lenses 20 so that their optical axes AX are parallel to one another. Lens holding member 30 also holds multiple semiconductor laser devices 10. Lens holding member 30 holds each of the semiconductor laser devices so that each of them faces each of collimate lenses 20 one to one. Lens holding member 30 is formed of brass for instance in consideration of heat dissipation properties and hardness for example.

Hereinafter, a description is made of the detailed configuration of collimate lens 20.

Figure 4:
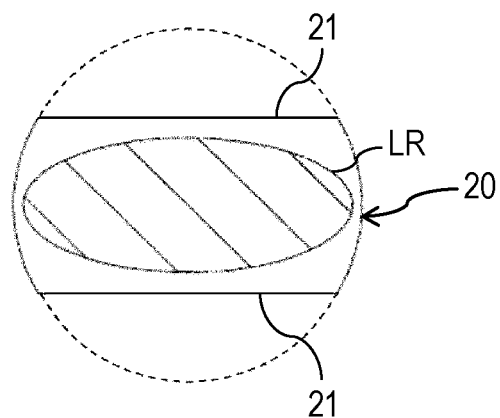
FIG. 4 is an external view of the planar shape of an I-shaped collimate lens and of a cross-sectional shape of a laser ray passing through the collimate lens.

FIG. 4 is an external view of the planar shape of collimate lens 20 according to the first embodiment. The planar shape refers to a shape of collimate lens 20 viewed from the top of the papers of FIGS. 2 and 3, namely a shape of collimate lens 20 viewed from the top face. The planar shape of each collimate lens 20 is a partial circle that is formed by cutting off part of the periphery of a circle. A partial circle is a shape formed by substituting a chord for an arc (i.e., part of a circle). The partial circle of the first embodiment is an I-shaped planar shape having a pair of parallel chords 21. Chords 21 are parallel to the row direction. Here, I-shaped planar collimate lens 20 is formed by parallel cutting off a circular collimate lens as a material at two positions of the periphery. Hence, as shown in FIG. 3, chord 21 agrees with a side surface of collimate lens 20 parallel to optical axis AX. Hereinafter, a side surface formed of chord 21 is referred to as a cut-off face. I-shaped collimate lens 20 has two cut-off faces, which are row-wise parallel to each other.

As shown in FIG. 1, collimate lenses 20 are disposed so that chords 21 of collimate lenses 20 column-wise adjacent to each other face each other. In other words, the cut-off faces of collimate lenses 20 adjacent to each other face each other. In such an arrangement state, collimate lenses 20 column-wise adjacent to each other have interval DC between the centers of the lenses that is smaller than diameter RC of these collimate lenses 20.

FIG. 4 also shows a cross-sectional shape of a laser ray passing through I-shaped collimate lens 20. Laser ray LR emitted from semiconductor laser device 10 has a fast axis and a slow axis. The shape of a cross section vertical to optical axis AX of laser ray LR is elliptical. Multiple semiconductor laser devices 10 are disposed so that the major axis of the ellipse of laser ray LR is row-wise parallel and the minor axis is column-wise parallel. Here, the planar shape of I-shaped collimate lens 20 is larger than the ellipse of laser ray LR. Thus, the ellipse of laser ray LR falls within the planar shape of collimate lens 20. Accordingly, entire laser ray LR appropriately transmits through I-shaped collimate lens 20.

Figure 5:
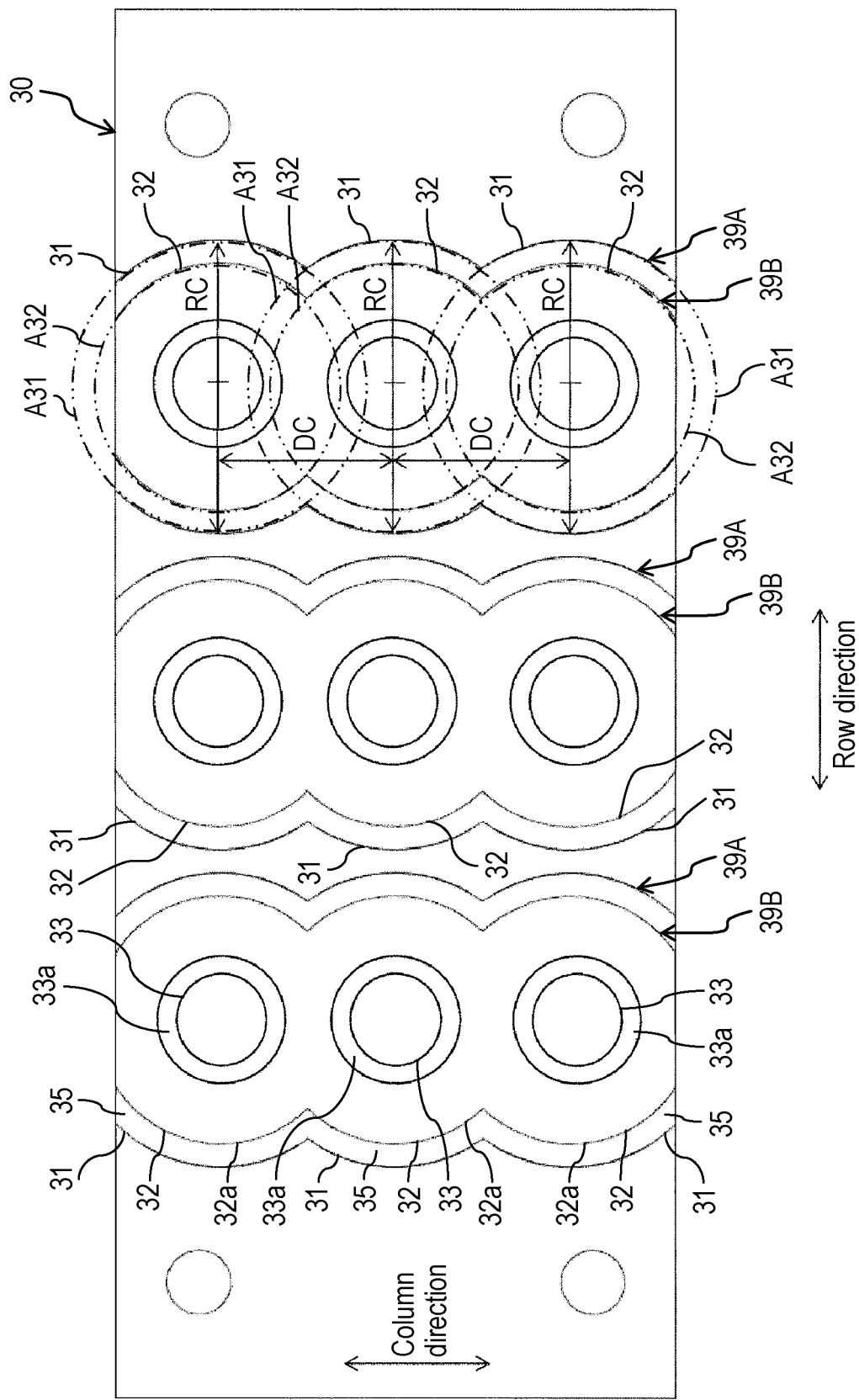
FIG. 5 is an external view of the planar shape of a lens holding member.

Hereinafter, a description is made of the detailed configuration of lens holding member 30 using FIGS. 2, 3, and 5. Here, FIG. 5 is an external view of the planar shape of lens holding member 30 according to the first embodiment. Lens holding member 30 is provided with multiple base containing holes 34, multiple light-emitting element containing holes 33, multiple laser ray passing-through (light passing-through) holes 32, and multiple lens arrangement holes 31, in sequence from the bottom of the papers of FIGS. 2 and 3. Base containing hole 34, light-emitting element containing hole 33, laser ray passing-through hole 32, and lens arrangement hole 31 are communicatively disposed vertically so that they each correspond. The central axes of these corresponding holes are disposed on the same axis center. Hereinafter, the configuration of these holes is described.

Base containing hole 34 is a through hole circular in the cross-sectional shape. Base containing hole 34 is open in the outer surface under lens holding member 30. Base containing hole 34 contains base 12 of semiconductor laser device 10.

Light-emitting element containing hole 33 is a through hole circular in the cross-sectional shape. Light-emitting element containing hole 33 contains light-emitting element 11 of semiconductor laser device 10. The diameter of the cross section of light-emitting element containing hole 33 is smaller than that of base containing hole 34. Hence, there is stepped surface 36 facing the bottom of FIG. 2 formed between light-emitting element containing hole 33 and base containing hole 34. Base 12 of semiconductor laser device 10 is fixed in a state pressed against stepped surface 36 from below, and thus light-emitting element 11 of semiconductor laser device 10 is fixed to light-emitting element containing hole 33. There is slope 33a formed on the side surface of light-emitting element containing hole 33 close to laser ray passing-through hole 32 so that the diameter of light-emitting element containing hole 33 increases toward laser ray passing-through hole 32. This slope 33a allows laser ray LR to be lead to laser ray passing-through hole 32 without laser ray LR being blocked by the side surface of light-emitting element containing hole 33.

Laser ray passing-through hole 32 is a hole that leads laser ray LR emitted from light-emitting element 11 of semiconductor laser device 10 to collimate lens 20. The cross-sectional shape of each of laser ray passing-through holes 32 is a partial circle and has a pair of arcs 32a facing each other in the row direction. The distance between arcs 32a of laser ray passing-through hole 32 facing each other, namely the diameter of the partial circle of laser ray passing-through hole 32, is smaller than diameter RC of collimate lens 20; larger than the major axis of the ellipse, which is the cross-sectional shape of laser ray LR. This prevents laser ray LR, which is an ellipse with its cross-sectional shape longer in the row direction, from being blocked by laser ray passing-through hole 32. Meanwhile, as shown in FIG. 5, among multiple laser ray passing-through holes 32, those column-wise adjacent to each other are linked together (i.e., communicating with each other) to form linked hole 39B. The planar shape of linked hole 39B represents part of the shape of a region formed by arranging multiple circular regions A32 in the column direction partially overlapped. Linked hole 39B does not have a partition wall that separates the region in the column direction. Hence, in the column direction, a phenomenon itself does not occur in which the side surface of laser ray passing-through hole 32 blocks laser ray LR.

Lens arrangement hole 31 is open in the outer surface above lens holding member 30. The row-wise diameter of lens arrangement hole 31 is larger than that of laser ray passing-through hole 32. Hence, as shown in FIG. 2, there is stepped surface 35 facing the top formed between laser ray passing-through hole 32 and lens arrangement hole 31. Here, each lens arrangement hole 31 has one collimate lens 20 disposed. Collimate lens 20 is disposed in lens arrangement hole 31 in a state pressed against stepped surface 35 from above. Meanwhile, as shown in FIG. 5, multiple lens arrangement holes 31 are provided in a matrix in the outer surface of lens holding member 30. Among multiple lens arrangement holes 31, those column-wise adjacent to each other are linked together (communicate) to form linked hole 39A. The planar shape of linked hole 39A represents part of the shape of a region formed by arranging multiple circular regions A31 in the column direction partially overlapped, where each of multiple circular regions A31 has a diameter larger than diameter RC of each collimate lens 20 by a predetermined minute amount. The predetermined minute amount is determined to an amount that does not cause an excessive stress on both collimate lens 20 and lens holding member 30 in consideration of temperature change while light source device 1 is in use and the manufacturing tolerance for example.

Lens arrangement hole 31, laser ray passing-through hole 32, light-emitting element containing hole 33, and base containing hole 34 of lens holding member 30 are formed using a drill with diameters same as those of the respective holes.

Figure 6:
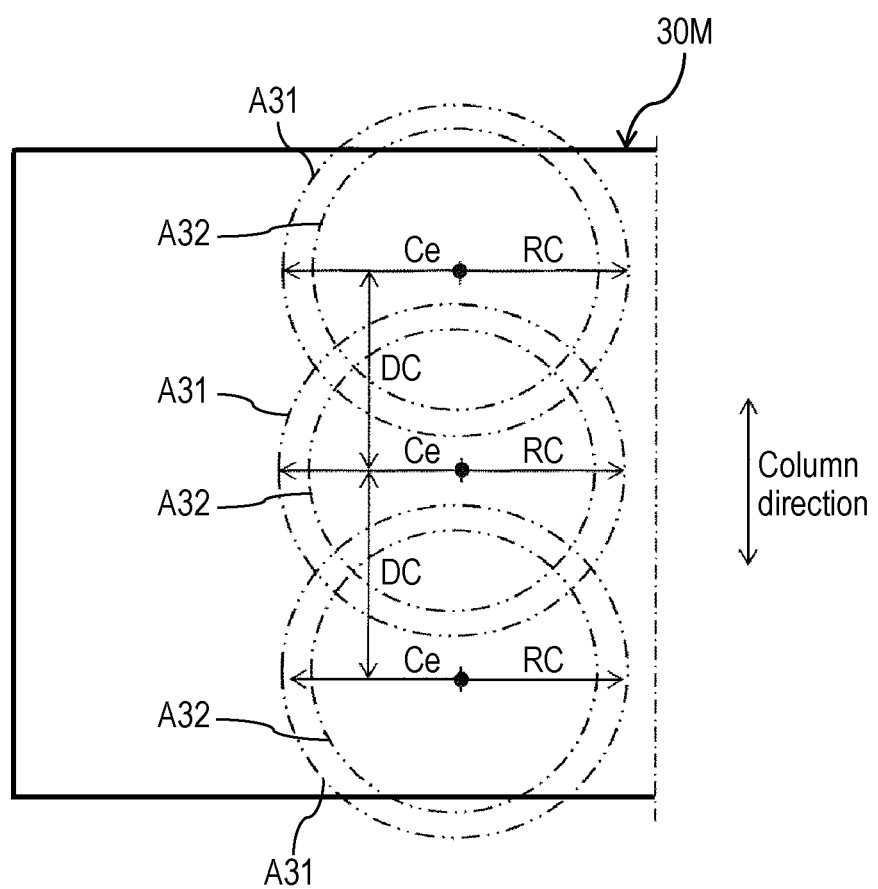
FIG. 6 illustrates a way of forming lens arrangement holes and laser ray passing-through holes.

Here, lens arrangement hole 31 and laser ray passing-through hole 32 are formed as linked holes 39A and 39B that have a shape of whole or part of a region formed by arranging multiple circular regions A31 and A32 in the column direction partially overlapped as described above. Accordingly, as shown in FIG. 6, lens arrangement hole 31 and laser ray passing-through hole 32 can be formed by moving back and forth a drill with the diameters same as those of circular regions A31 and A32, at position Ce where lens arrangement hole 31 and laser ray passing-through hole 32 are to be formed in material 30M of lens holding member 30.

Figure 7:
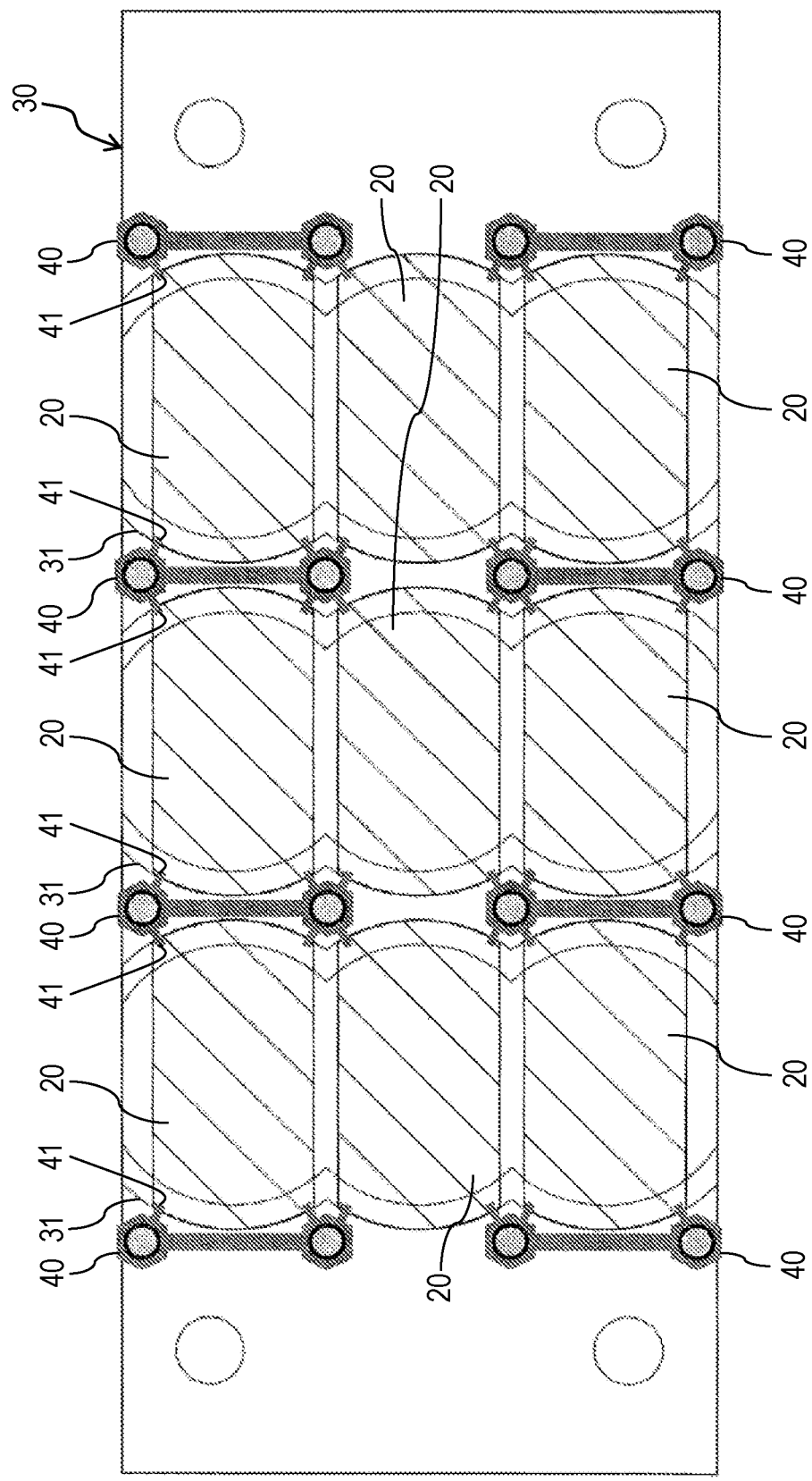
FIG. 7 is an external view of the planar shape of lens retaining springs.

FIG. 7 is an external view of the planar shape of light source device 1 having lens retaining springs. Light source device 1 may be provided with lens retaining springs 40 shown in FIG. 7 for example in order to prevent collimate lens 20 from dropping off lens arrangement hole 31 of lens holding member 30. Lens retaining spring 40 is shaped like a plate with the column direction being a longitudinal direction. Lens retaining spring 40 is fixed to lens holding member 30 with screws for example at the two ends in the longitudinal direction of lens retaining spring 40. Lens retaining spring 40 has arms 41 each at each of the two ends in the longitudinal direction. These arms 41 press collimate lens 20 against stepped surface 35 (refer to FIG. 2) of lens holding member 30. Resultingly, collimate lens 20 is stably retained inside lens arrangement hole 31.

Here, with the configuration in which collimate lens 20 is pressed with lens retaining spring 40, collimate lens 20 can rotate about the lens center inside lens arrangement hole 31. This rotation, however, is limited to the extent that collimate lens 20 touches an adjacent one. The planar shape of I-shaped collimate lens 20 is determined to a shape within which entire laser ray LR with its cross section elliptical passes through I-shaped collimate lens 20 even when collimate lens 20 rotates within the above-described range.

Figure 8:
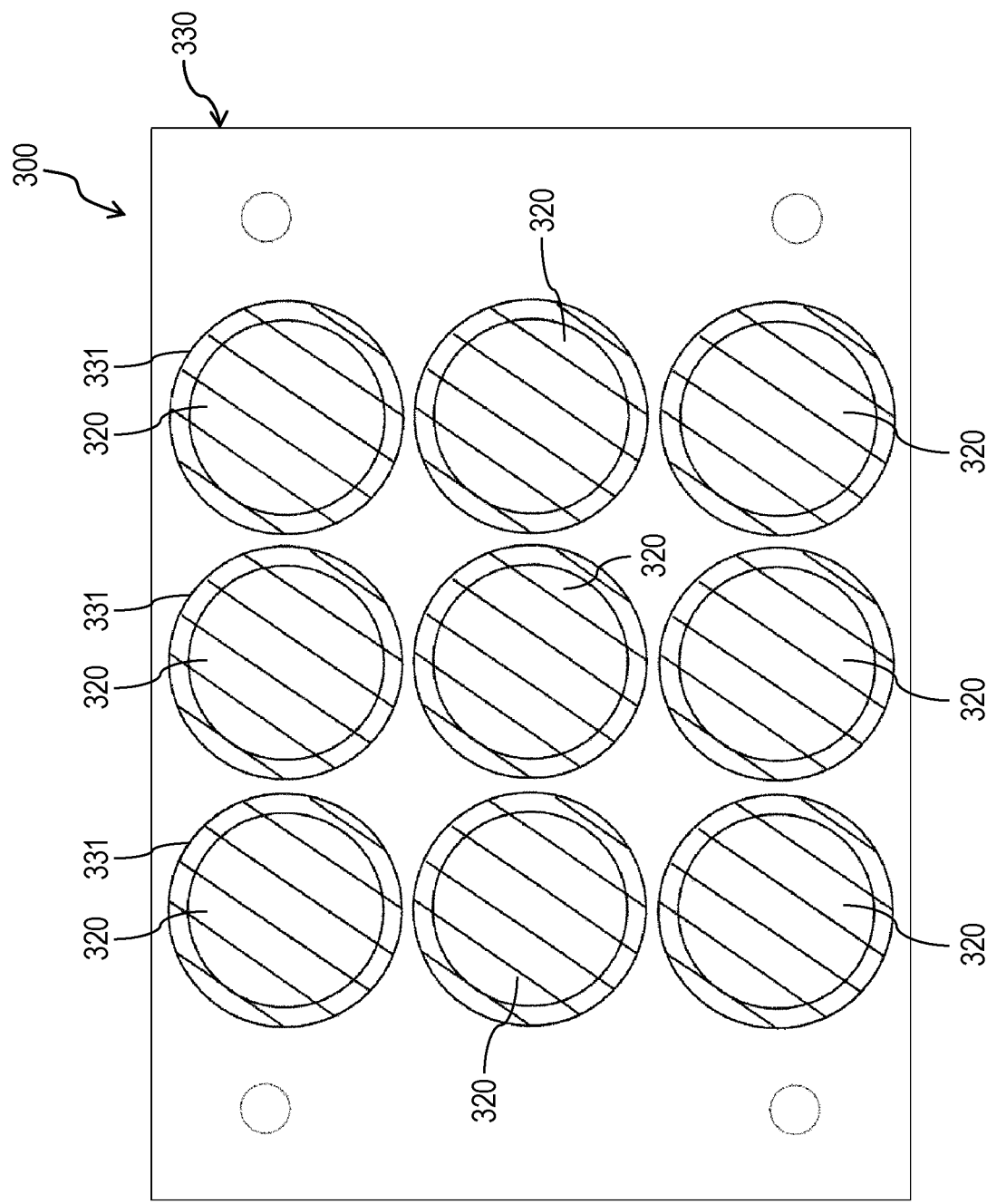
FIG. 8 is an external view of the planar shape an existing light source device.

FIG. 8 is an external view of the planar shape of an existing light source device. In existing light source device 300, lens holding member 330 has multiple circular lens arrangement holes 331 formed in a matrix to fit multiple circular collimate lenses 320 into the holes. Here, in order to dispose multiple circular collimate lenses 320 with high density, the diameter of collimate lens 320 needs to be reduced to a size of approximately the diameter of the base of semiconductor laser device 310.

Figure 9:
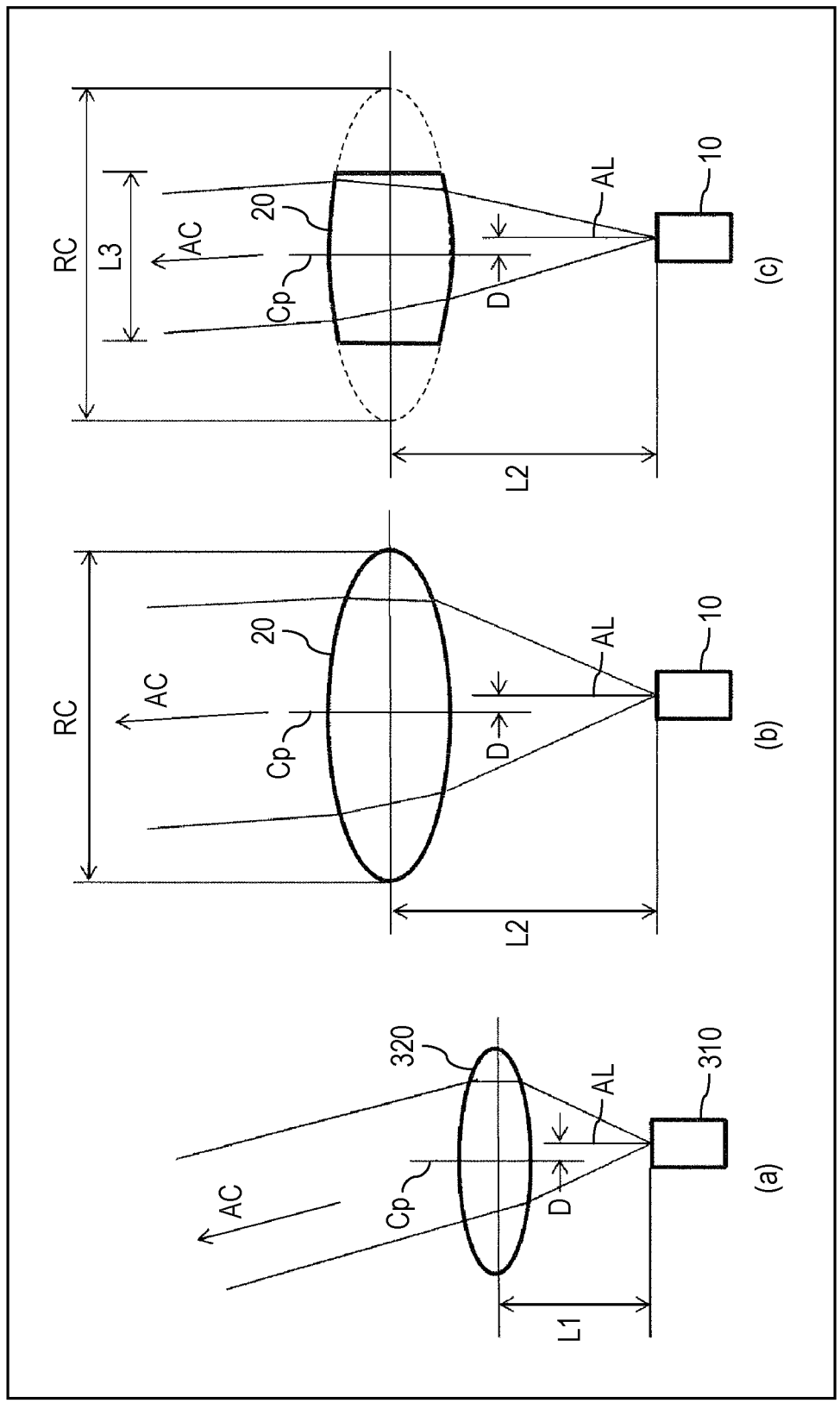
FIG. 9 illustrates a disadvantage of an existing light source device and an advantage of the light source device according to the first embodiment.

FIG. 9 illustrates a disadvantage of existing light source device 300 and an advantage of light source device 1 according to the first embodiment. As shown in FIG. 9 (a), existing light source device 300 has a circular collimate lens as collimate lens 320. The diameter of lens arrangement hole 331 of lens holding member 330 is determined to a size slightly larger than the diameter of circular collimate lens 320. However, in a case where the diameter of collimate lens 320 is reduced to a size of approximately the diameter of the base of semiconductor laser device 310 to dispose multiple circular collimate lenses 320 with high density, focal length L1 of collimate lens 320 shortens. With focal length L1 of collimate lens 320 shortening, optical axis AC of a laser ray that has passed through collimate lens 320 largely inclines relative to optical axis AL of a laser ray emitted from semiconductor laser device 310 when center position Cp of collimate lens 320 disposed inside lens arrangement hole 331 deviates from optical axis AL of semiconductor laser device 310. For this reason, adjusting center position Cp of collimate lens 320 requires a greatly accurate jig and highly sophisticated skills.

In order to solve this problem, the following arrangement is made in the first embodiment as shown in FIG. 9 (b). That is, diameter RC of collimate lens 20 is made larger than that of collimate lens 320, and focal length L2 is made longer than focal length L1. Resultingly, even if center position Cp of collimate lens 20 deviates by distance D that is nearly equal to the case of FIG. 9 (a), optical axis AC of a laser ray that has passed through collimate lens 20 inclines not so much as the case of FIG. 9 (a). This facilitates adjusting lens positions.

Larger diameter RC of collimate lens 20 for longer focal length L2, however, causes the size of a light source device larger than existing light source device 300 of FIG. 8, which is a new disadvantage.

In order to solve this problem, light source device 1 of the first embodiment is further arranged as described using FIGS. 1 and 5. That is, the planar shape of collimate lens 20 is I-shaped where a chord is substituted for an arc (i.e., part of a circle). Besides, chords 21 of collimate lenses 20 column-wise adjacent to each other are disposed to face each other. Furthermore, distance DC between the centers of collimate lenses 20 column-wise adjacent to each other is made smaller than diameter RC of these collimate lenses 20. Resultingly, as shown in FIG. 9 (c), column-wise length L3 of collimate lens 20 can be made smaller than diameter RC.

This suppresses an increase of light source device 1 in size especially in the column direction compared to a case where the diameter of collimate lens 20 is simply enlarged to prolong the focal length. Besides, even if center position Cp of collimate lens 20 in the column direction deviates by distance D nearly equal to the case of FIG. 9 (a), optical axis AC of a laser ray that has passed through collimate lens 20 does not incline relative to optical axis AL of a laser ray emitted from semiconductor laser device 10 to an extent of the case of FIG. 9 (a), which is an advantage.

Figure 10:
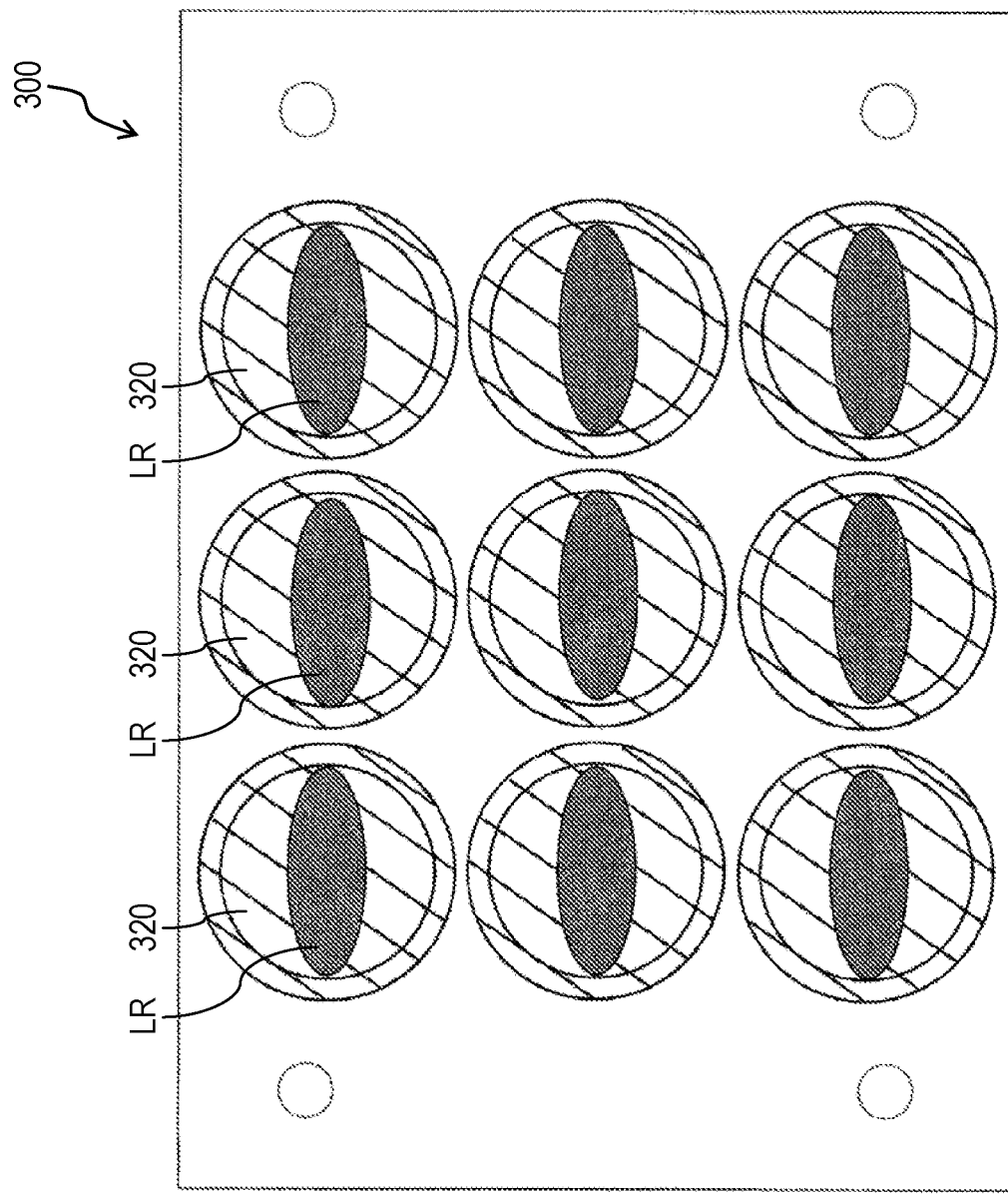
FIG. 10 illustrates the distribution of laser rays converged by the existing light source device.
Figure 11:
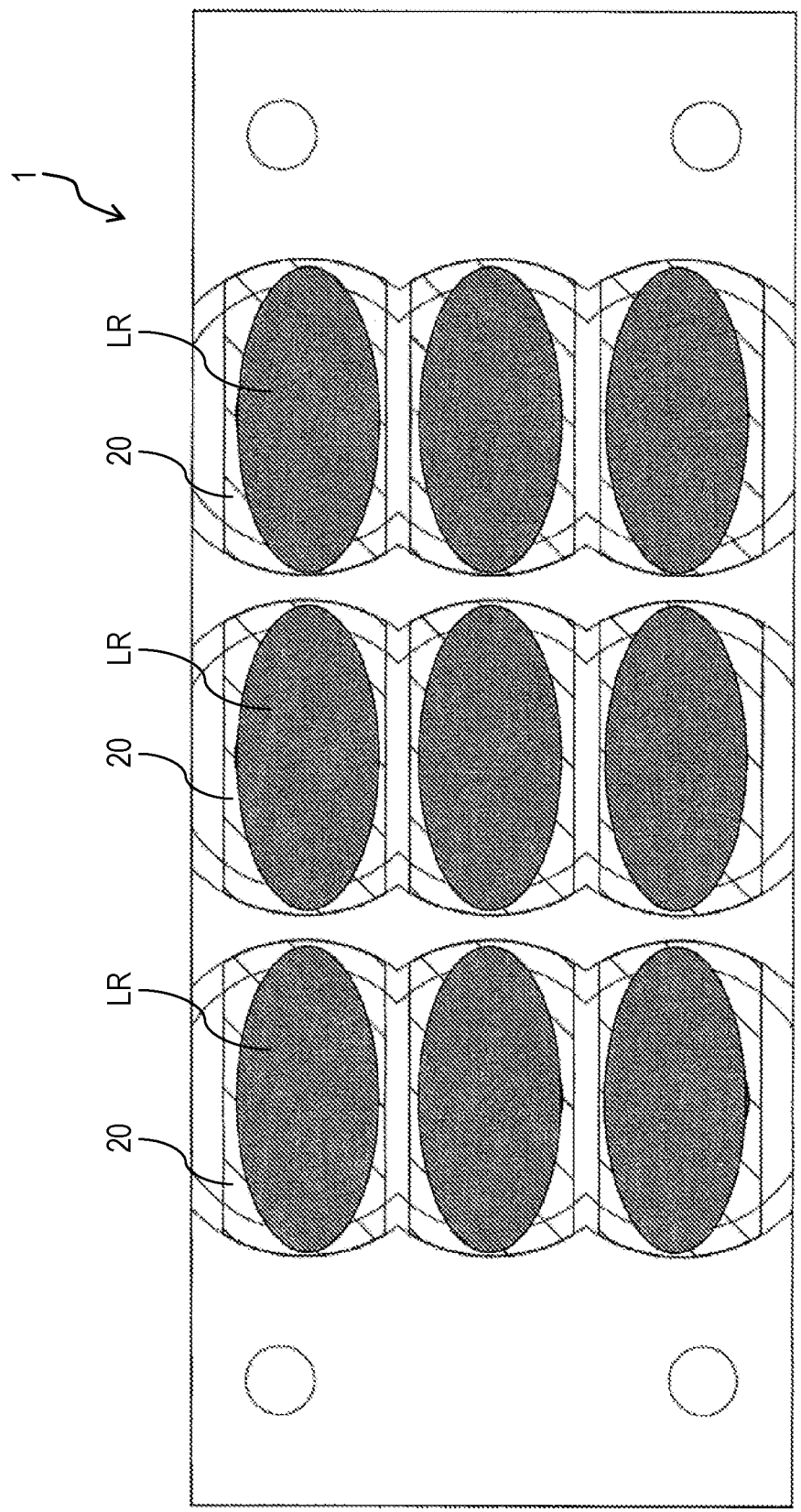
FIG. 11 illustrates the distribution of laser rays converged by the light source device according to the first embodiment.

The first embodiment also provides the following advantage. FIG. 10 illustrates the distribution of laser rays converged or collimated by existing light source device 300. FIG. 11 illustrates the distribution of laser rays converged or collimated by light source device 1 of the first embodiment. As shown in FIG. 10, existing light source device 300 has a diameter of collimate lens 320 smaller than that of light source device 1 of the first embodiment, and has a long column-wise distance between collimate lenses 320 relative to the diameter. This results in a lower density of the disposition of collimate lenses 320. Accordingly, laser ray LR converged or collimated by collimate lens 320 has a low area density and an uneven distribution of the light amount. Meanwhile, light source device 1 of the first embodiment has a large diameter of collimate lens 20 and a short distance between collimate lenses 20 relative to the diameter as shown in FIG. 11. This results in a high density of the disposition of collimate lenses 20. Consequently, laser ray LR converged or collimated by collimate lens 20 has a high area density, thereby suppressing an uneven distribution of the light amount.

Figure 12:
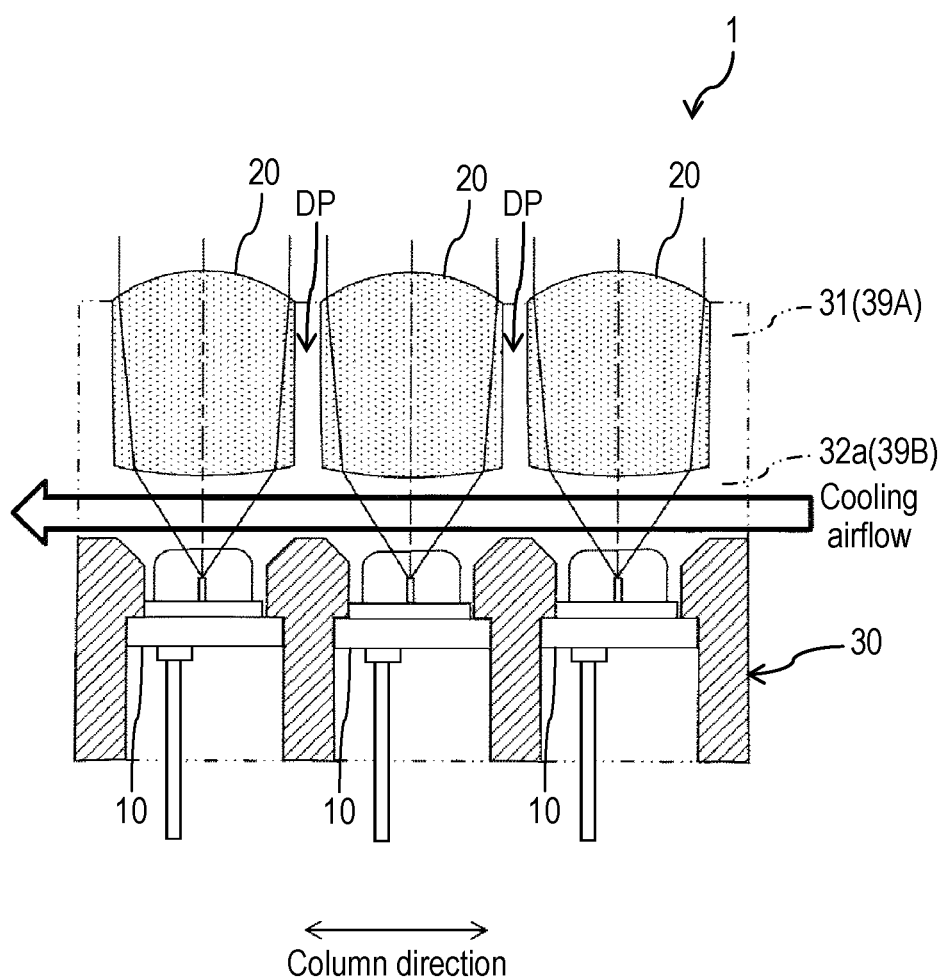
FIG. 12 illustrates another advantage according to the first embodiment.

FIG. 12 illustrates another advantage of light source device 1 according to the first embodiment. In lens holding member 30 of light source device 1 of the first embodiment, multiple laser ray passing-through holes 32 column-wise adjacent to each other are formed as part of linked hole 39B, and a partition wall is not present between laser ray passing-through holes 32. In other words, laser ray (light) passing-through holes 32 column-wise adjacent to each other link (communicate) with each other. Accordingly, sending cooling airflow by a fan for example from a column-wise first end causes the airflow to pass through the inside of laser ray passing-through hole 32 (linked hole 39B) in the column direction. This cooling airflow cools semiconductor laser device 10 more favorably. Besides, there are gaps (air holes) DP each between cut-off faces 21 of collimate lenses 20 column-wise adjacent to each other (i.e., adjacent to each other in a first direction), and the air holes DP are linked to (communicate with) the light passing-through holes 32. Accordingly, heat can be diffused to the outside through these air holes DP, thereby cooling semiconductor laser device 10 more effectively.

Figure 13:
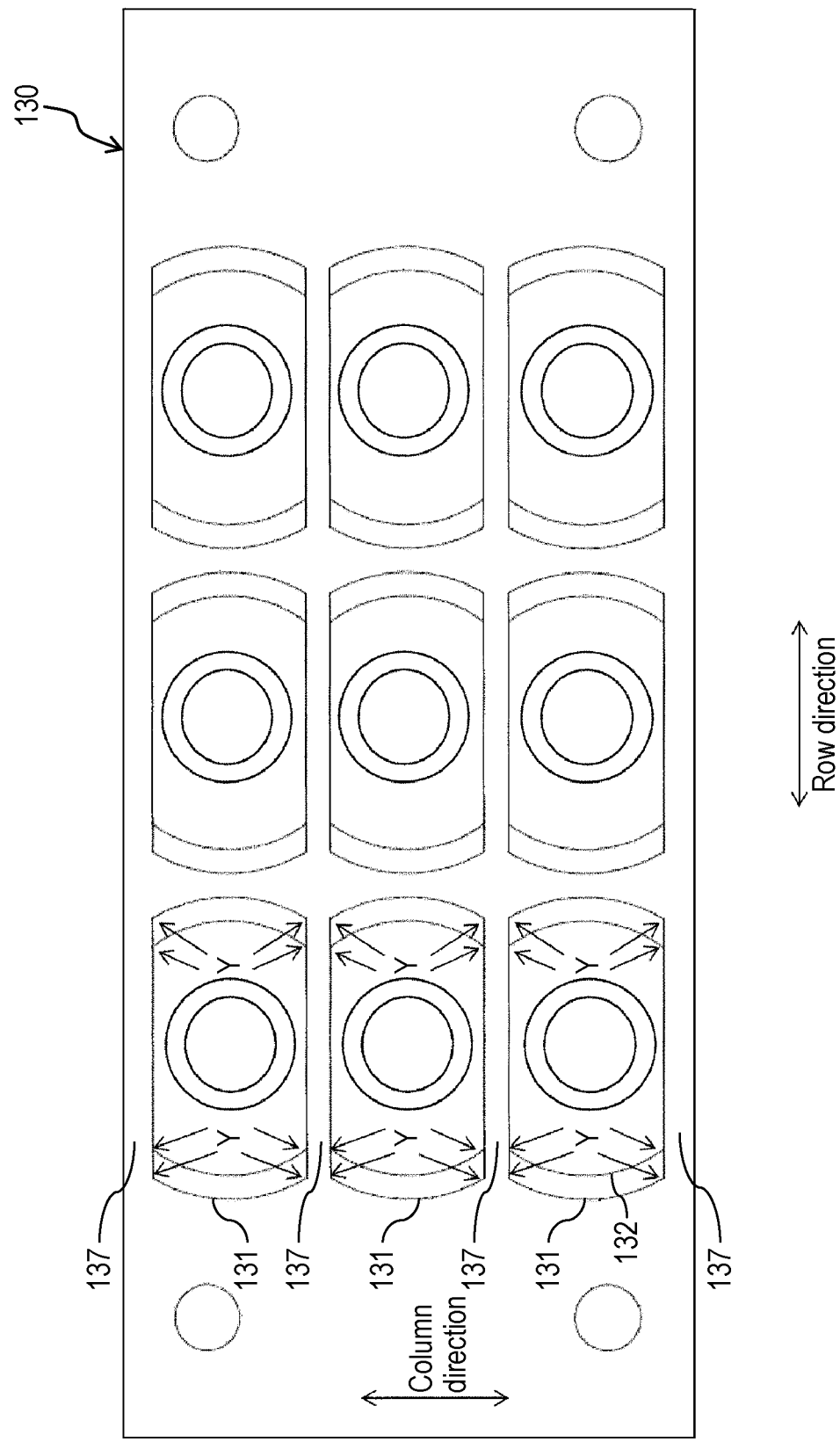
FIG. 13 is an external view of the planar shape of the lens holding member (examination example 1) holding I-shaped collimate lenses.
Figure 14:
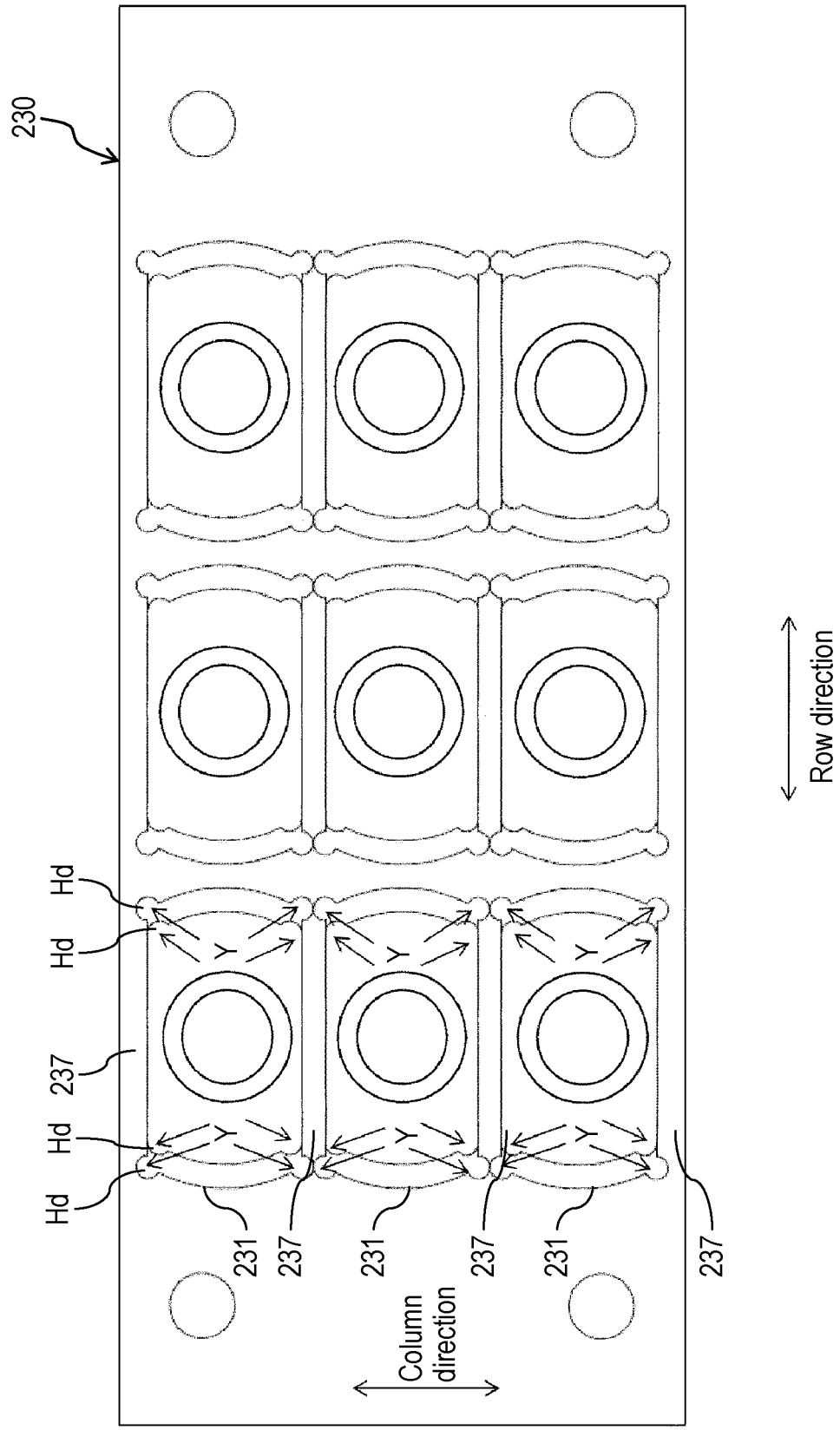
FIG. 14 is an external view of the planar shape of the lens holding member (examination example 2) holding I-shaped collimate lenses.

Another advantage of the first embodiment is described by comparing examination example 1 of FIG. 13 with examination example 2 of FIG. 14. FIG. 13 is an external view of the planar shape of the lens holding member (examination example 1) holding I-shaped collimate lens 20. The inventor of the present application has also examined lens holding member 130 of FIG. 13 as a lens holding member that holds multiple I-shaped collimate lenses 20. In the configuration of FIG. 13, lens arrangement hole 131 has the same planar shape as that of I-shaped collimate lens 20 described above (FIG. 13 does not illustrate I-shaped collimate lens 20). This configuration has partition wall 137 provided separating collimate lenses 20 from each other between lens arrangement holes 131 column-wise adjacent to each other. In such a configuration, to form lens arrangement hole 131 correspondingly to the shape of I-shaped collimate lens 20, run-off part Y (to become a corner) is formed between the chord and the arc of the planar shape of lens arrangement hole 131. In the same way, to form laser ray passing-through hole 132 as in the first embodiment correspondingly to the shape of I-shaped collimate lens 20, run-off part Y (to become a corner) is formed between the chord and the arc of the planar shape of lens arrangement hole 132. Precisely forming these run-off parts Y requires precise machining, which may increase the cost of producing lens holding member 130.

FIG. 14 is an external view of the planar shape of the lens holding member (examination example 2) holding I-shaped collimate lens 20. The inventor of the present application has also examined lens holding member 230 of FIG. 14 as a lens holding member that holds multiple I-shaped collimate lenses 20 in order to reduce production costs. This configuration, in the same way as the case of FIG. 13, has partition wall 237 provided separating collimate lenses 20 from each other between lens arrangement holes 231 column-wise adjacent to each other. Run-off part Y of lens holding member 230 is formed with drill hole Hd. With this configuration, run-off part Y can be easily formed. However, as a result that the row-wise ends of partition wall 237 are scraped, partition wall 237 may incline in the column direction due to an external force.

Under the circumstances, the inventor of the present application, through close examination, has achieved findings about the configuration of lens holding member 30 of the first embodiment described in FIG. 5. That is, multiple lens arrangement holes 31 of lens holding member 30 form linked hole 39A. The planar shape of linked hole 39A represents part of the shape of a region formed by arranging multiple circular regions in the column direction partially overlapped, where each of multiple circular regions has a diameter larger than the diameter of each collimate lens 20 by a predetermined minute amount. Accordingly, a partition wall for separating the column direction is not present. Resultingly, lens arrangement hole 31 can be easily formed by simply moving back and forth a circular drill in the axis direction, at a position where each lens arrangement hole 31 is to be formed in lens holding member 30. Besides, the absence of a partition wall eliminates the need for a run-off part as well as machining it, thereby reducing production costs.

In the same way, multiple laser ray passing-through holes 32 of lens holding member 30 form linked hole 39B. Linked hole 39B also does not have a partition wall separating the column direction. Resultingly, lens arrangement hole 32 can be easily formed by simply moving back and forth a circular drill in the axis direction, at a position where each lens arrangement hole 32 is to be formed. Besides, the absence of a partition wall eliminates the need for a run-off part as well as machining it, thereby reducing production costs.

Second Exemplary Embodiment

Figure 15:
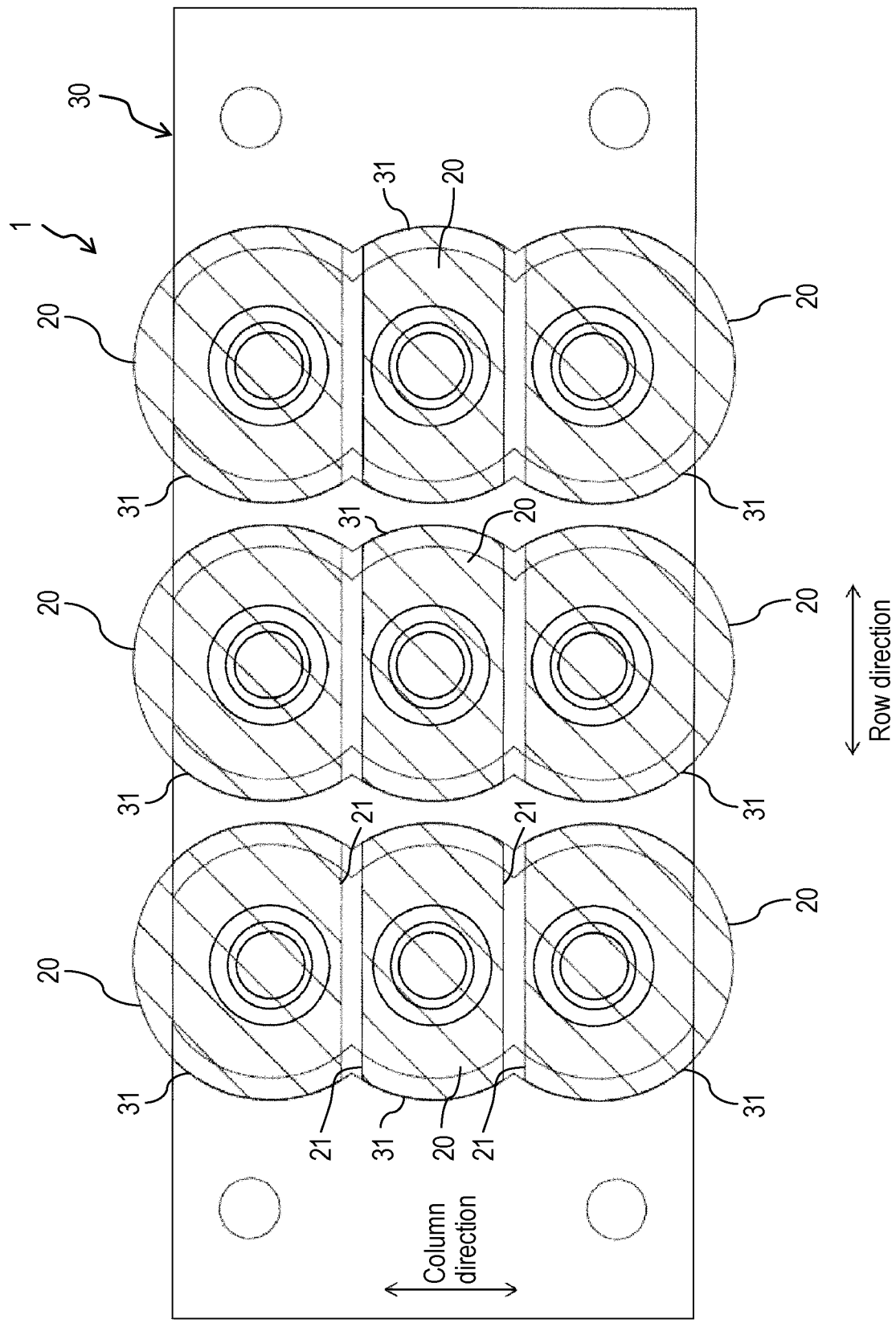
FIG. 15 is an external view of the planar shape of a light source device according to the second exemplary embodiment.
Figure 16:
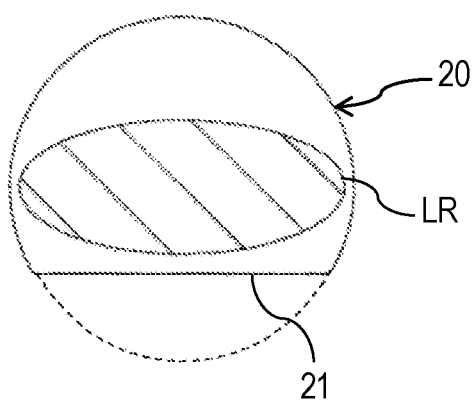
FIG. 16 is an external view of the planar shape of a D-shaped collimate lens and of the cross-sectional shape of a laser ray passing through the collimate lens.

A description is made of the second exemplary embodiment. FIG. 15 is an external view of the planar shape of light source device 1 according to the second embodiment. FIG. 16 is an external view of the planar shape of D-shaped collimate lens 20. In the second embodiment, among multiple collimate lenses 20, each planar shape of those disposed at one end and the other end in the column direction is D-shaped. In other words, among multiple collimate lenses 20, those on the first row (close to the top end) and on the last row (close to the bottom end) are D-shaped. A D-shaped planar shape means that the shape of collimate lens 20 as viewed from the top is a shape formed by substituting a chord for an arc (part of a circle). In other words, a D-shape is a shape that has one chord 21. Chord 21 of D-shaped collimate lens 20 faces chord 21 of adjacent I-shaped collimate lens 20. The other configurations are the same as those of the first embodiment. To form I-shaped collimate lens 20 from a circular collimate lens as a material of collimate lens 20, part of the outer periphery of the circular collimate lens needs to be cut twice. On the other hand, D-shaped collimate lens 20 is formed only by cutting once part of the outer periphery of a circular collimate lens as a material. This reduces worker hours and costs of processing collimate lens 20. FIG. 16 also shows the cross-sectional shape of a laser ray passing through D-shaped collimate lens 20. D-shaped collimate lens 20 has a D-shaped planar shape. Meanwhile, laser ray LR emitted from semiconductor laser device 10 has a fast axis and a slow axis as described above, and a cross section vertical to optical axis AX of laser ray LR is elliptical. Multiple semiconductor laser devices 10 are disposed so that the major axis of the ellipse of laser ray LR is row-wise parallel (i.e., the minor axis of the ellipse is column-wise parallel). D-shaped collimate lens 20 is disposed so that the direction in which chord 21 is extendedly disposed is parallel to the row direction. Accordingly, D-shaped collimate lens 20 can transmit entire laser ray LR appropriately.

Third Exemplary Embodiment

Figure 17:
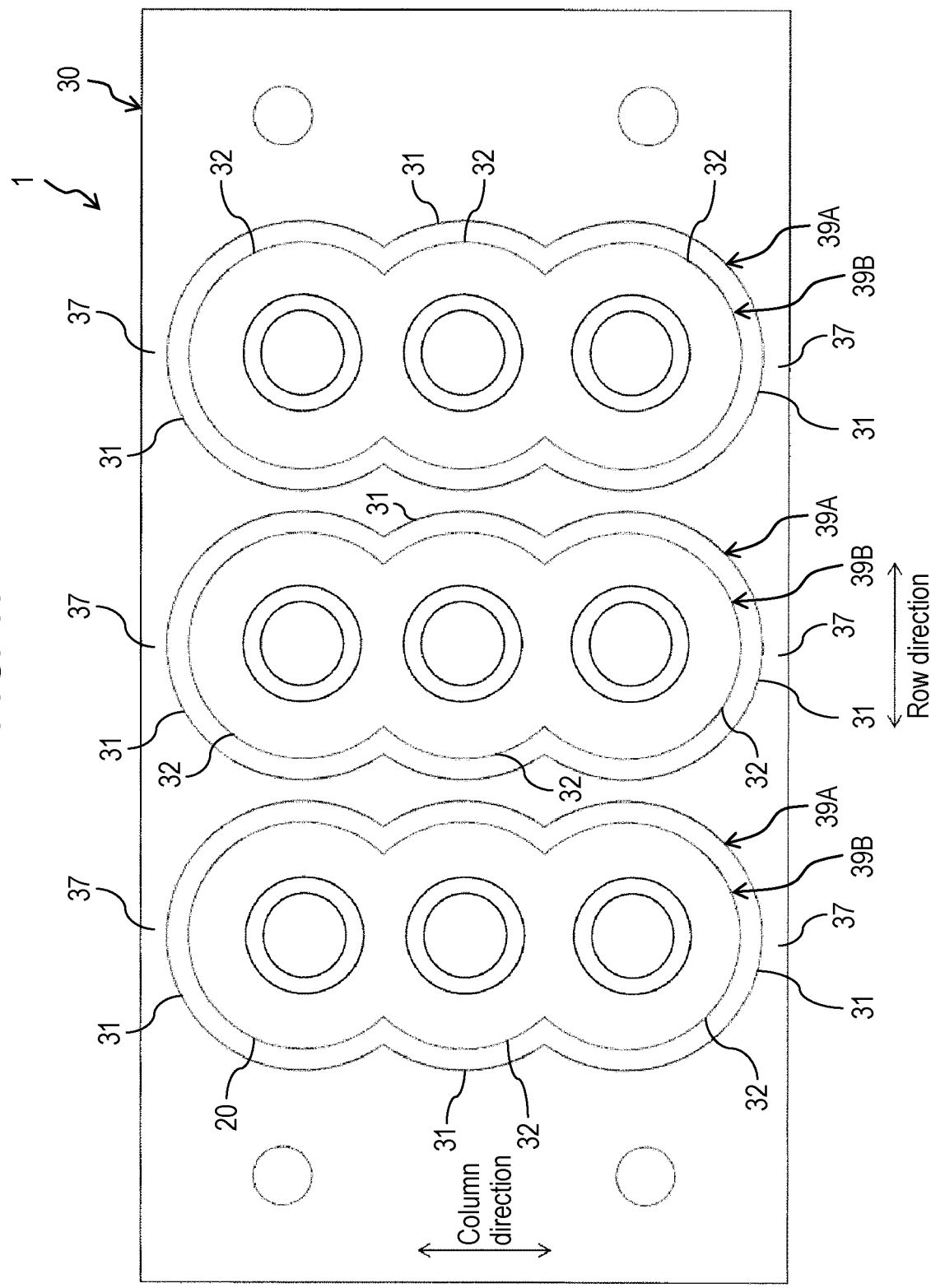
FIG. 17 is an external view of the planar shape of a lens holding member according to the third exemplary embodiment.
Figure 18:
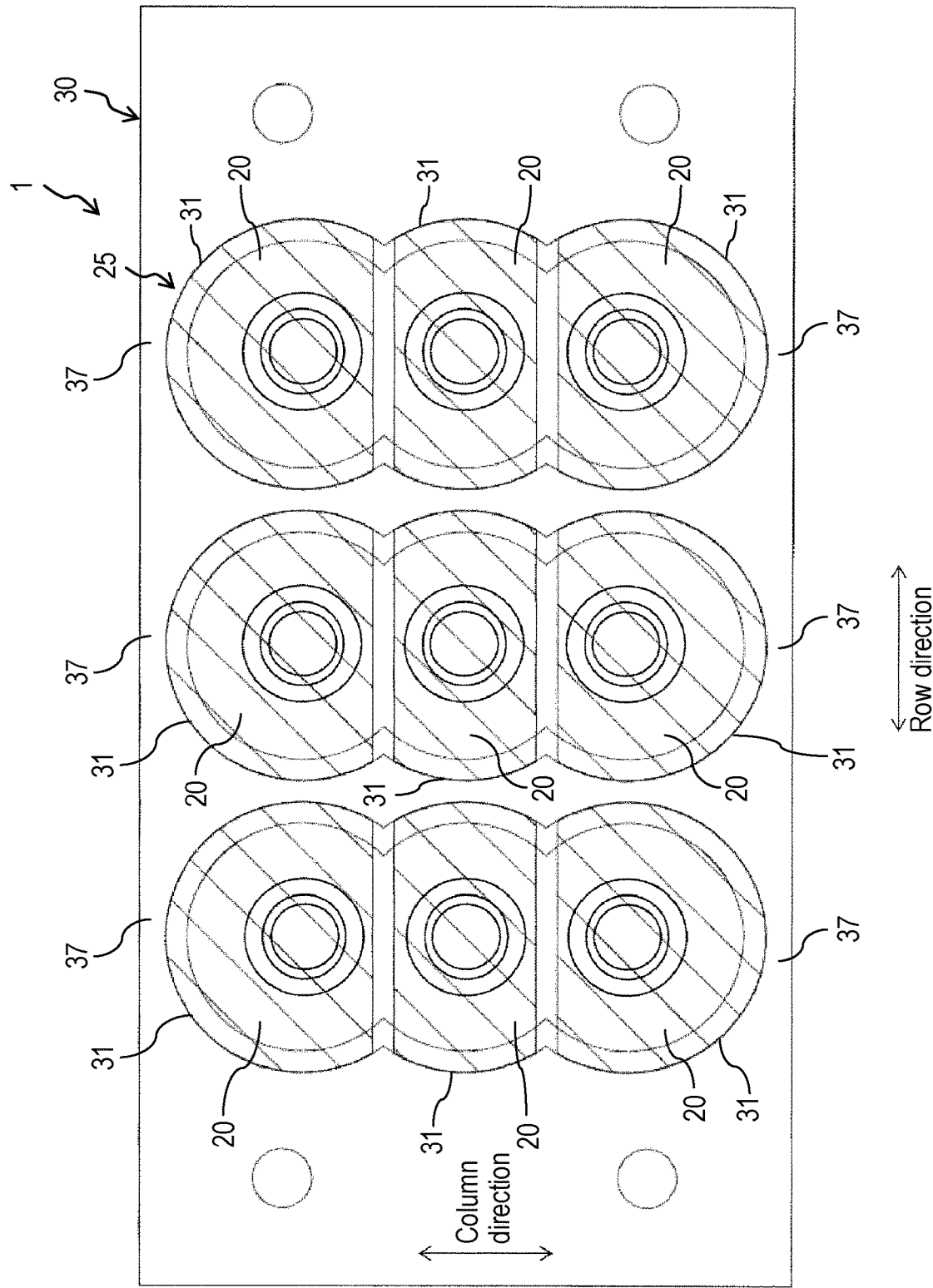
FIG. 18 is an external view of the planar shape of a light source device according to the third exemplary embodiment.

A description is made of the third exemplary embodiment. FIG. 17 is an external view of the planar shape of lens holding member 30 according to the third embodiment. FIG. 18 is an external view of the planar shape of light source device 1 according to the third embodiment. In the third embodiment, optical system 25 has the same configuration as that of the second embodiment; however, lens holding member 30 has a different structure. Concretely, lens holding member 30 has outer walls 37 at the column-wise ends of linked holes 39A and 39B. In other words, lens holding member 30 has outer walls 37 at the column-wise ends of lens arrangement hole 31 and laser ray passing-through hole 32, where the holes are located at one end and the other end of lens holding member 30 in the column direction (i.e., at the column-wise ends of lens arrangement hole 31 and laser ray disposition hole 32 on the first row and the last row). The inner-surface shape of outer wall 37 corresponds to the outer-periphery shape of D-shaped collimate lens 20. Multiple lens arrangement holes 31 form linked hole 39A. Also, multiple lens arrangement holes 32 form linked hole 39B. The shape of linked holes 39A and 39B represents part of the shape of a region formed by arranging multiple circular regions in the column direction partially overlapped, where each of multiple circular regions has a diameter larger than that of collimate lens 20 by a predetermined minute amount. Such a configuration effectively protects collimate lenses 20 (D-shaped collimate lenses 20) on the first row and the last row (one end and the other end in the column direction).

Figure 19:
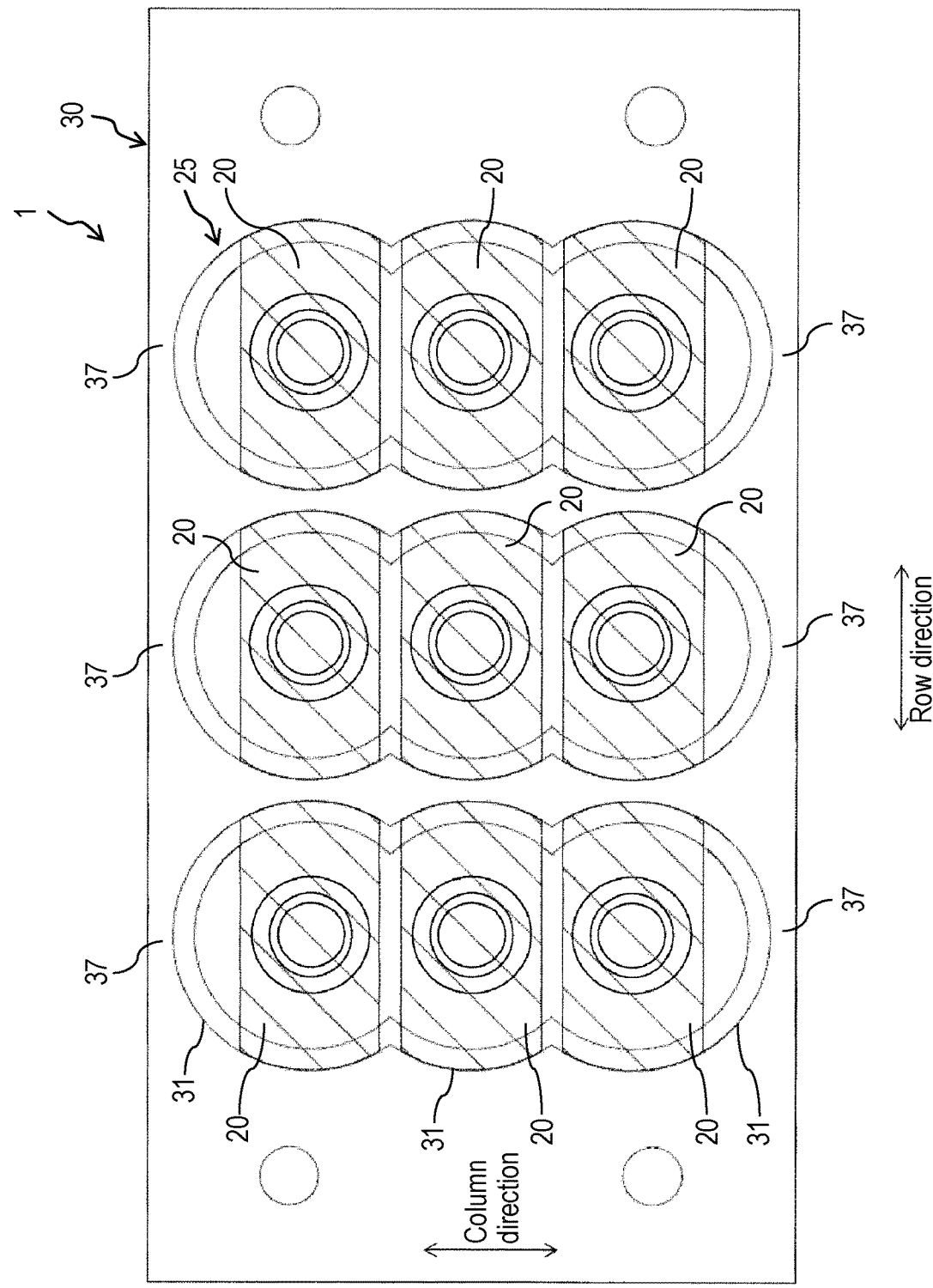
FIG. 19 is an external view of the planar shape of another example of a light source device of the third embodiment.

FIG. 19 is an external view of the planar shape of another example of light source device 1 of the third embodiment. As shown in FIG. 19, lens holding member 30 of the third embodiment allows I-shaped collimate lens 20 to be disposed at each of D-shaped lens arrangement holes 31 at one end and the other end in the column direction.

Fourth Exemplary Embodiment

Figure 20:
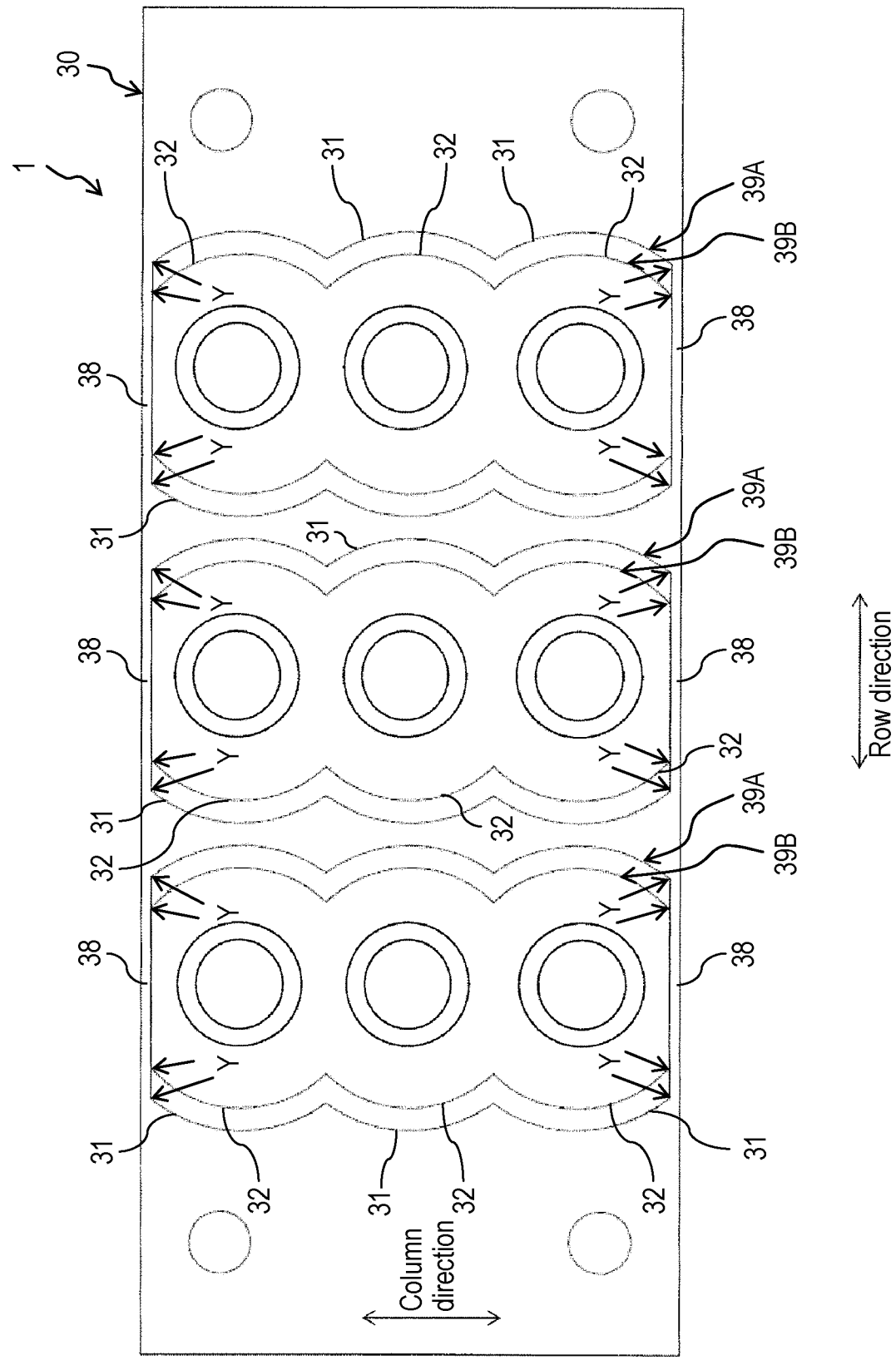
FIG. 20 is an external view of the planar shape of a lens holding member according to the fourth exemplary embodiment.
Figure 21:
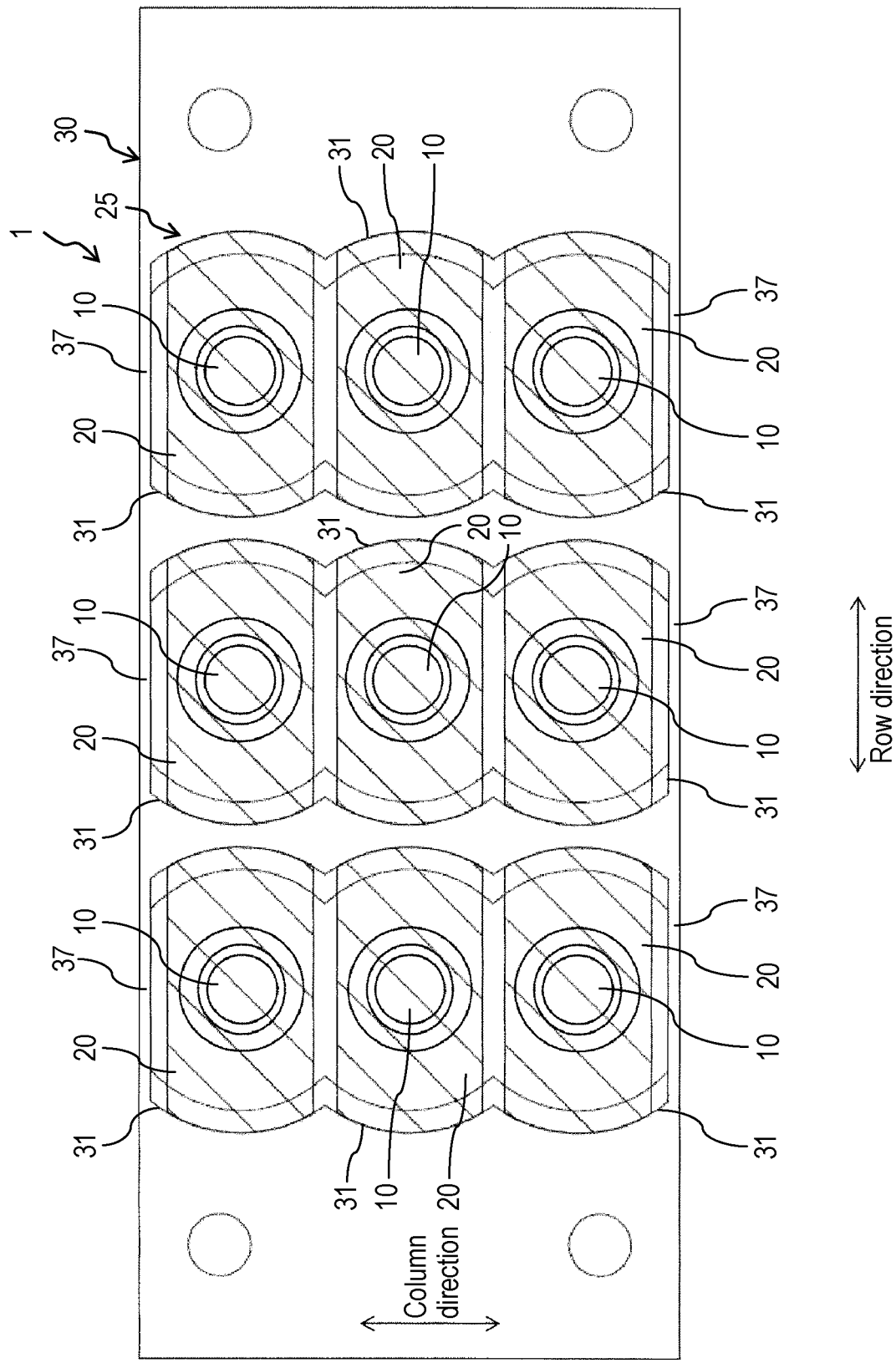
FIG. 21 is an external view of the planar shape of a light source device according to the fourth embodiment.

A description is made of the fourth exemplary embodiment. FIG. 20 is an external view of the planar shape of lens holding member 30 according to the fourth embodiment. FIG. 21 is an external view of the planar shape of light source device 1 according to the fourth embodiment. In the fourth embodiment, optical system 25 has the same configuration as that of the first embodiment; however, lens holding member 30 has a different structure. Concretely, the fourth embodiment has outer walls 38 at the column-wise ends of lens arrangement hole 31 and laser ray passing-through hole 32 (linked holes 39A and 39B) that hold I-shaped collimate lenses 20 on the first row and the last row. The inner-surface shape of this outer wall 38 corresponds to the outer-periphery shape of I-shaped collimate lens 20. Such a configuration effectively protects collimate lens 20. Here, although machining of run-off part Y is required, the absence of a partition wall corresponding to partition wall 137 of FIG. 13 reduces regions where precision machining is required as compared to the case of examination example 1 of FIG. 13, which reduces worker hours and costs of processing lens holding member 30.

Fifth Exemplary Embodiment

Figure 22:
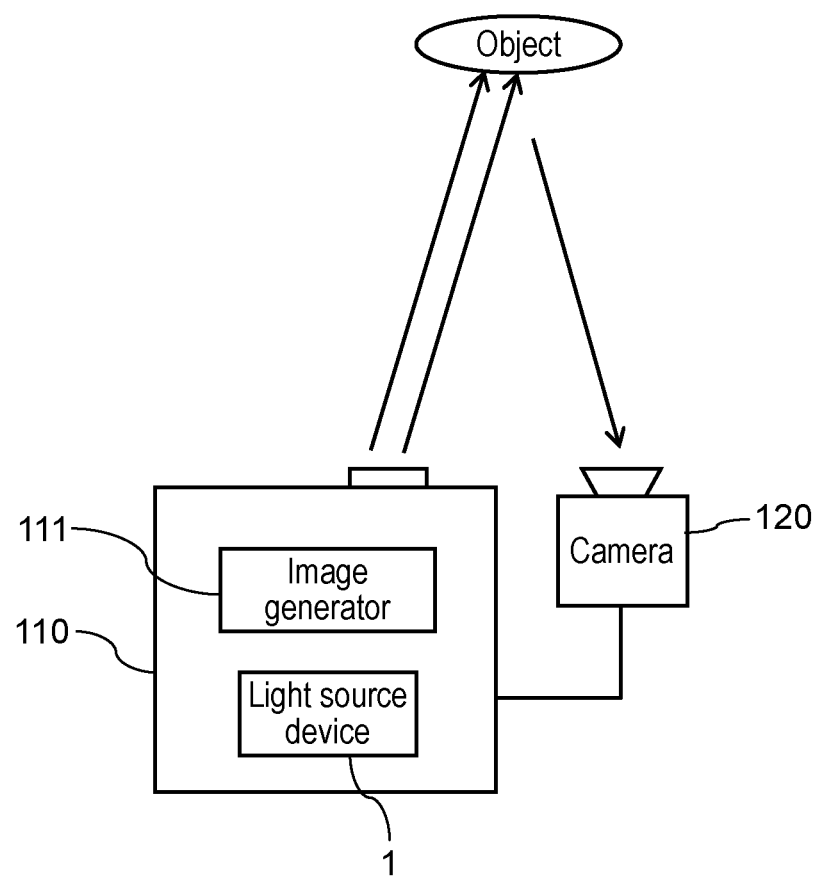
FIG. 22 is a block diagram illustrating the configuration of a projection display apparatus according to the fifth exemplary embodiment.

A description is made of the fifth exemplary embodiment. FIG. 22 illustrates the overview of a motion-tracking projector system according to the fifth embodiment. The motion-tracking projector system projects visible-light images following a moving body. The motion-tracking projector system includes projector 110 and camera 120. Projector 110 includes light source device 1 and image generator 111 according to the embodiments first to fourth. Light source device 1 is capable of generating infrared light. In the motion-tracking projector system, projector 110 projects a space-coded pattern of infrared light generated by light source device 1 toward an area where a subject is present. Camera 120 images the pattern projected. Image generator 111 calculates the shape of the subject based on the pattern imaged by camera 120, generates a visible-light image corresponding to the subject shape, and projects the image to the subject. In such a motion-tracking projector system, using light source device 1 according to the embodiments first to fourth as a light source device emitting infrared light suppresses the upsizing of projector 110.

Advantages

Optical system 25 of the embodiments first to fourth includes multiple collimate lenses 20 (an example of a lens) each of which converges laser rays emitted from multiple semiconductor laser devices 10. Multiple collimate lenses 20 are disposed in a matrix and so that these optical axes AX are parallel to one another. The shape of each of multiple collimate lenses 20 viewed from the top is a partial circle that is formed by cutting off part of the periphery of a circle. In other words, the shape of each of multiple collimate lenses 20 viewed from the top has chord 21 (cut-off part). Chord 21 forms a cut-off face of collimate lens 20. Cut-off faces of collimate lenses 20 adjacent to each other in the column direction (first direction) face each other. Distance DC between the centers of collimate lenses 20 column-wise adjacent to each other is smaller than the diameter of the partial circle of these collimate lenses 20.

With optical system 25 of the embodiments first to fourth, multiple collimate lenses 20 each of which converges laser rays emitted from multiple semiconductor laser devices 10 can be disposed with high density.

In the embodiments first to fourth, the partial circle is an I-shape or a D-shape formed by substituting a chord for an arc (i.e., part of the periphery of a circle). Collimate lens 20 disposed between a first end and a second end in the column direction has an I-shaped planar shape. Furthermore, at least one of collimate lenses 20 at one end and the other end in the column direction may have a D-shaped planar shape. Alternatively, the following arrangement may be made. That is, collimate lenses 20 each are disposed at one end and the other end in the column direction (a total of two collimate lenses are disposed in the column direction), and collimate lenses 20 each have a D-shaped planar shape.

In optical system 25 of the embodiments first to fourth, a cross section vertical to the optical axis of laser ray LR is elliptical, and the planar shape (partial circle) of each collimate lens 20 is determined so that the entire ellipse of laser ray LR can be transmitted. This allows laser ray LR to be transmitted even if the planar shape of each collimate lens 20 is a partial circle.

Lens holding member 30 of the embodiments first to fourth holds multiple collimate lenses 20 composing optical system 25 of the embodiments first to fourth. Lens holding member 30 is provided with multiple lens arrangement holes 31, where each of multiple collimate lenses 20 is disposed, in a matrix on the outer surface of lens holding member 30. Multiple lens arrangement holes 31 form linked hole 39A. The shape of linked hole 39A represents part of the shape of a region formed by arranging multiple circular region A31 in the column direction partially overlapped, where each of multiple circular regions has diameter RC larger than that of collimate lens 20 by a predetermined minute amount.

Lens holding member 30 of the first to fourth embodiments allows collimate lenses 20 of optical system 25 of the embodiments first to fourth to be disposed with high density. Also, lens arrangement hole 31 of lens holding member 30 can be simply formed with a drill.

In lens holding member 30 of the embodiments first to fourth, there is a laser ray passing-through hole 32 provided between collimate lens 20 and semiconductor laser device 10. Among multiple laser rays passing-through holes 32, those column-wise (first direction) adjacent to each other are linked. This allows semiconductor laser device 10 to be cooled by sending air from column-wise one end.

Lens holding member 30 of the embodiments first to fourth is formed of brass. This provides lens holding member 30 with appropriate heat dissipation properties and strength.

Lens holding member 30 of the embodiments first to fourth includes lens retaining springs 40 each of which presses each collimate lens 20 against the inside of corresponding lens arrangement hole 31. This allows collimate lens 20 to be stably retained inside lens arrangement hole 31.

Light source device 1 of the embodiments first to fourth is provided correspondingly to optical system 25 of the embodiments first to fourth, to lens holding member 30 of the embodiments first to fourth, and to each of multiple collimate lenses 20 of optical system 25, and includes multiple semiconductor laser devices 10 emitting laser rays. Resultingly, light source device 1 can be downsized.

In light source device 1 of the embodiments first to fourth, multiple semiconductor laser devices 10 are disposed with the minor axis of the ellipse of laser ray LR in the column direction. This allows collimate lens 20 to transmit entire laser ray LR efficiently.

Other Exemplary Embodiments

The present disclosure is not limited to the above-described embodiments first to fifth, but can be modified and changed in various ways within a scope that does not deviate from the gist of the disclosure.

Figure 23:
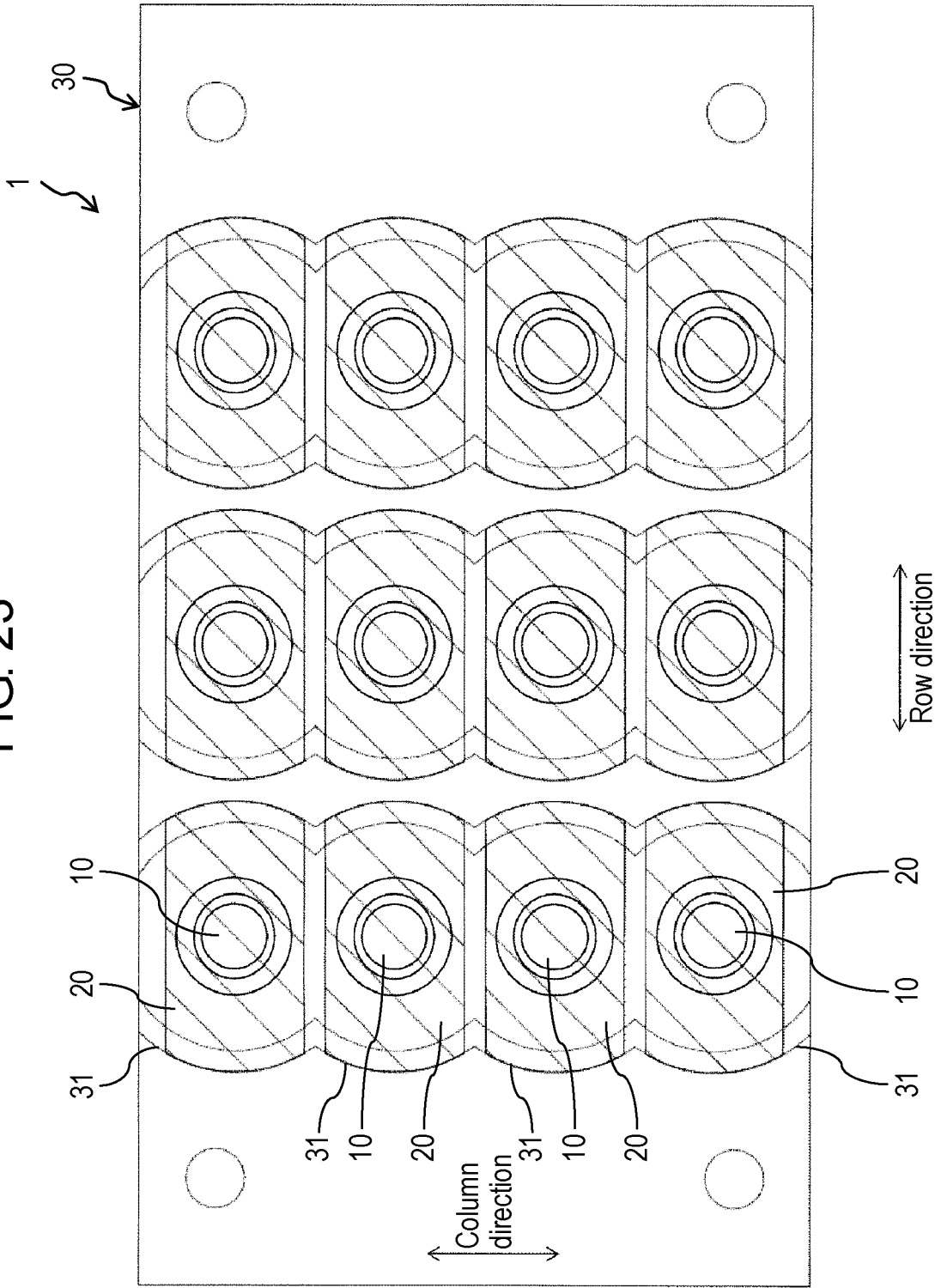
FIG. 23 is an external view of the planar shape of a light source device according to another exemplary embodiment.
Figure 24:
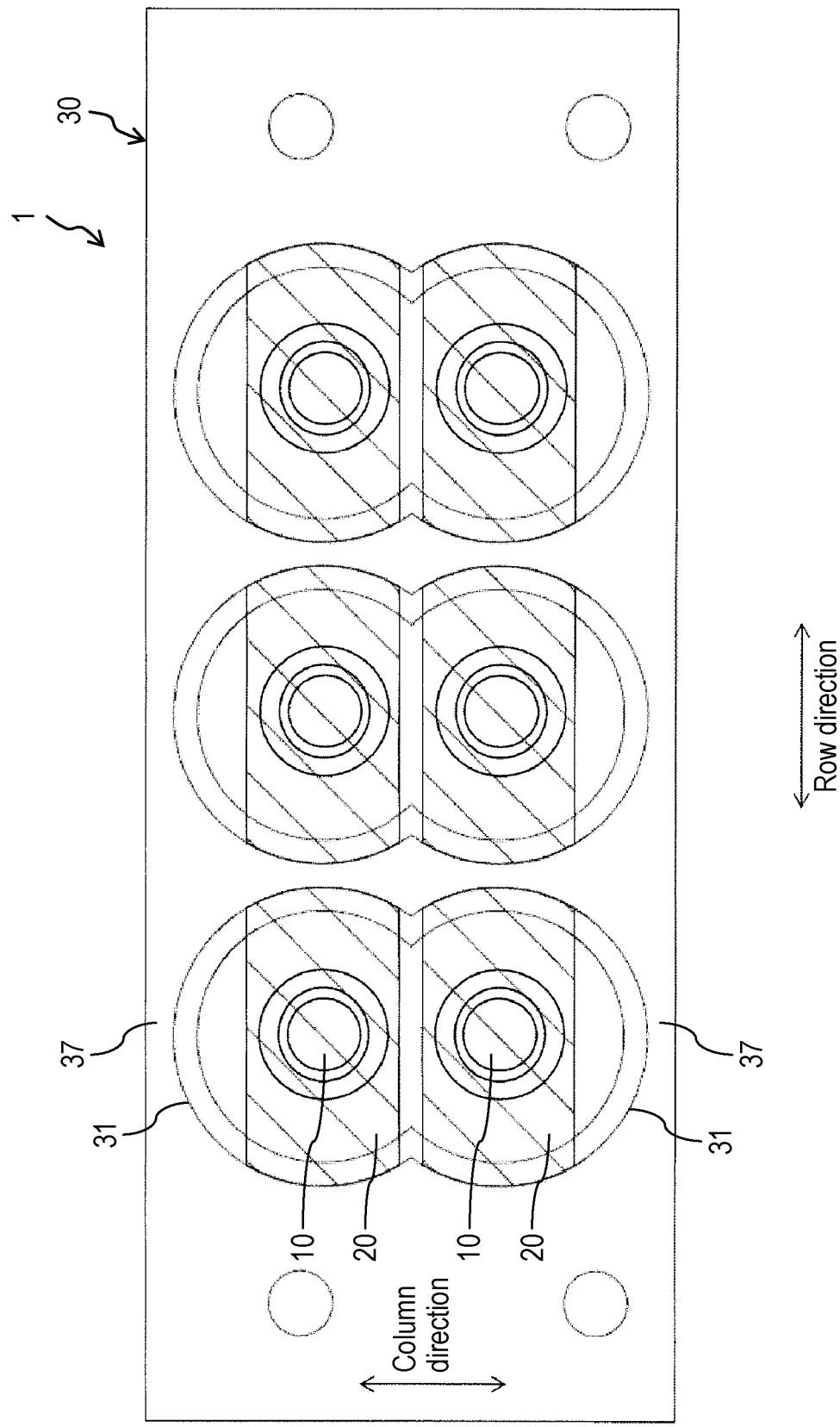
FIG. 24 is an external view of the planar shape of a light source device according to another exemplary embodiment.

(1) In the embodiments first to fourth, the description is made of the case where the matrix of collimate lenses 20 of optical system 25 is 3 rows by 3 columns in dimensions. In the present disclosure, however, a matrix is not limited to 3 rows by 3 columns. The present disclosure extensively applicable to a matrix of n rows by m columns (n and m are integers), excluding 1 row by 1 column. For example, FIG. 23 shows the case of 4 rows by 3 columns instead of the case of 3 rows by 3 columns in FIG. 1. FIG. 24 shows the case of 2 rows by 3 columns instead of the case of 3 rows by 3 columns in FIG. 18.

Figure 25:
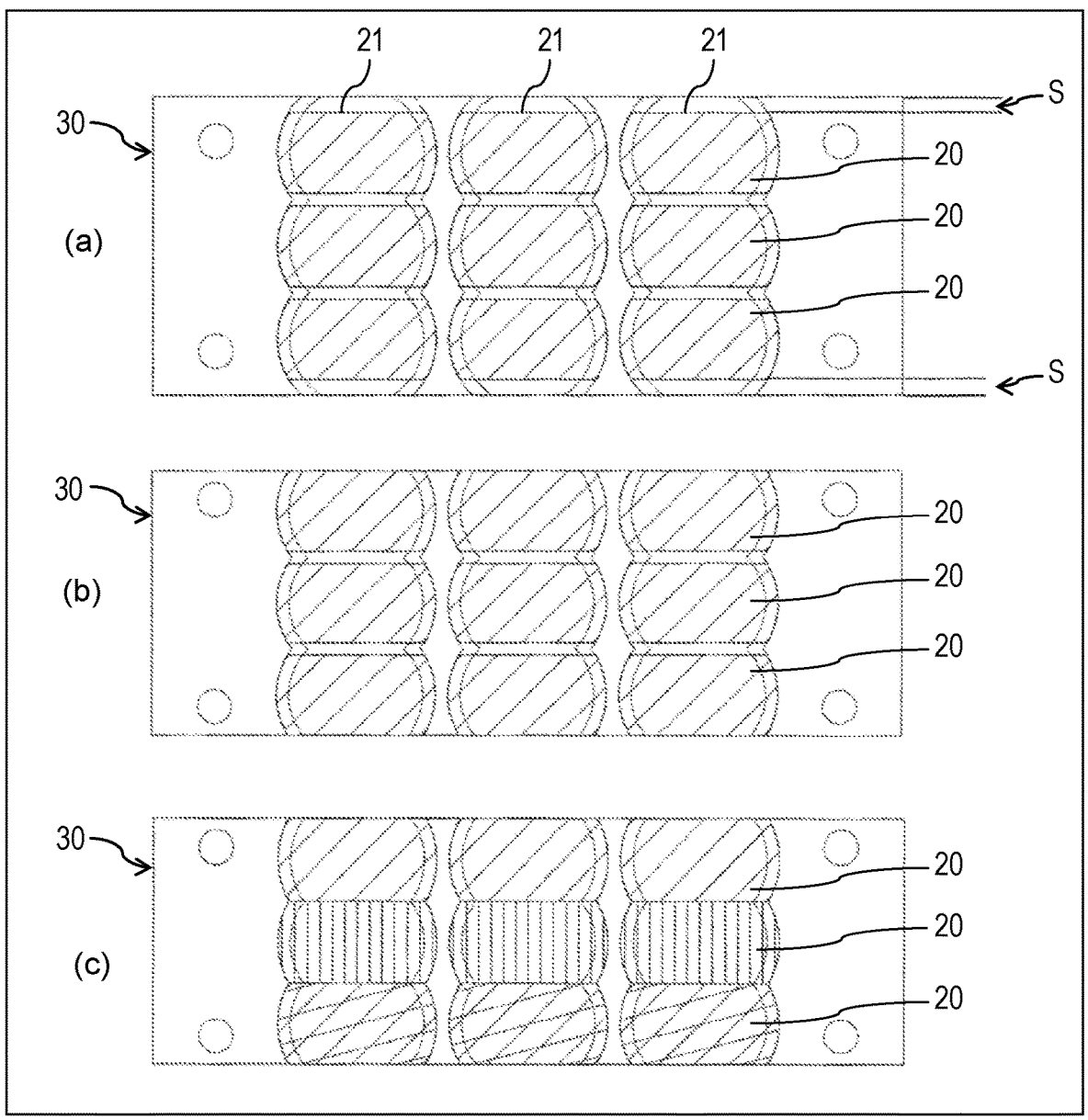
FIG. 25 is an external view of the planar shape of a light source device according to another exemplary embodiment.

(2) In the first embodiment, as shown in FIG. 25 (a), the position of chord 21 of each collimate lens 20 at one end and the other in the column direction is displaced from the position of the side surface of lens holding member 30 in the column direction by distance S. As shown in FIG. 25 (b), however, the position of chord 21 of each collimate lens 20 on the first and the last lines (at one end and the other in the column direction) may be made to agree with the position of the side surface of lens holding member 30 in the column direction. This allows the column-wise size of light source device 1 to be smaller. Besides, as shown in FIG. 25 (c), chords 21 of collimate lenses 20 column-wise adjacent to each other may be made close to each other to the utmost for a minimum size of the gap. This allows the column-wise size of light source device 1 to be further smaller. A minimum size of the gap means a gap for which collimate lens 20 on a middle line between the first line and the last does not break due to thermal expansion caused by temperature changes while light source device 1 is being used even if a compressive force is exerted from the first line and the last.

Figure 26:
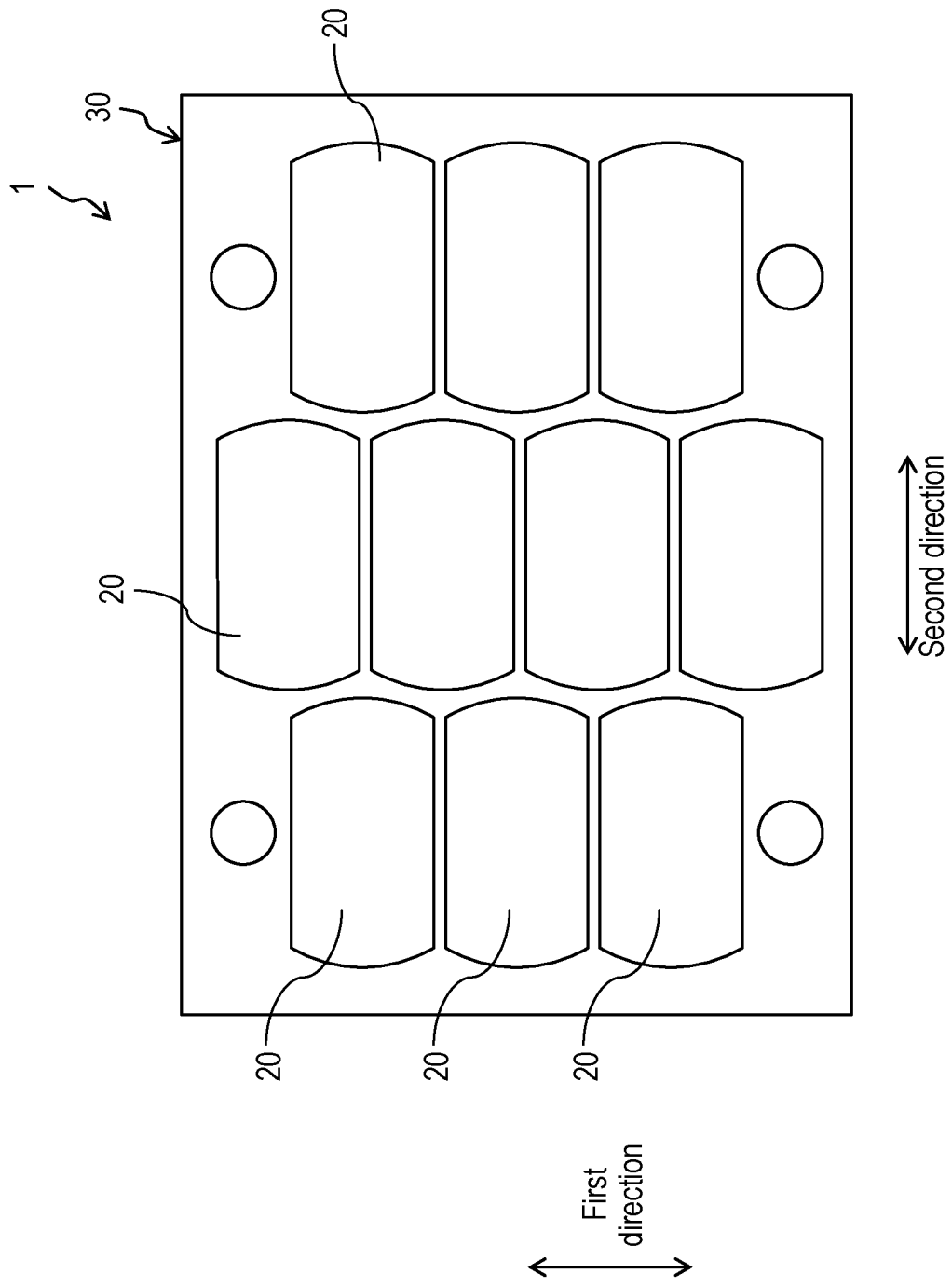
FIG. 26 is an external view of the planar shape of a light source device according to another exemplary embodiment.
Figure 27:
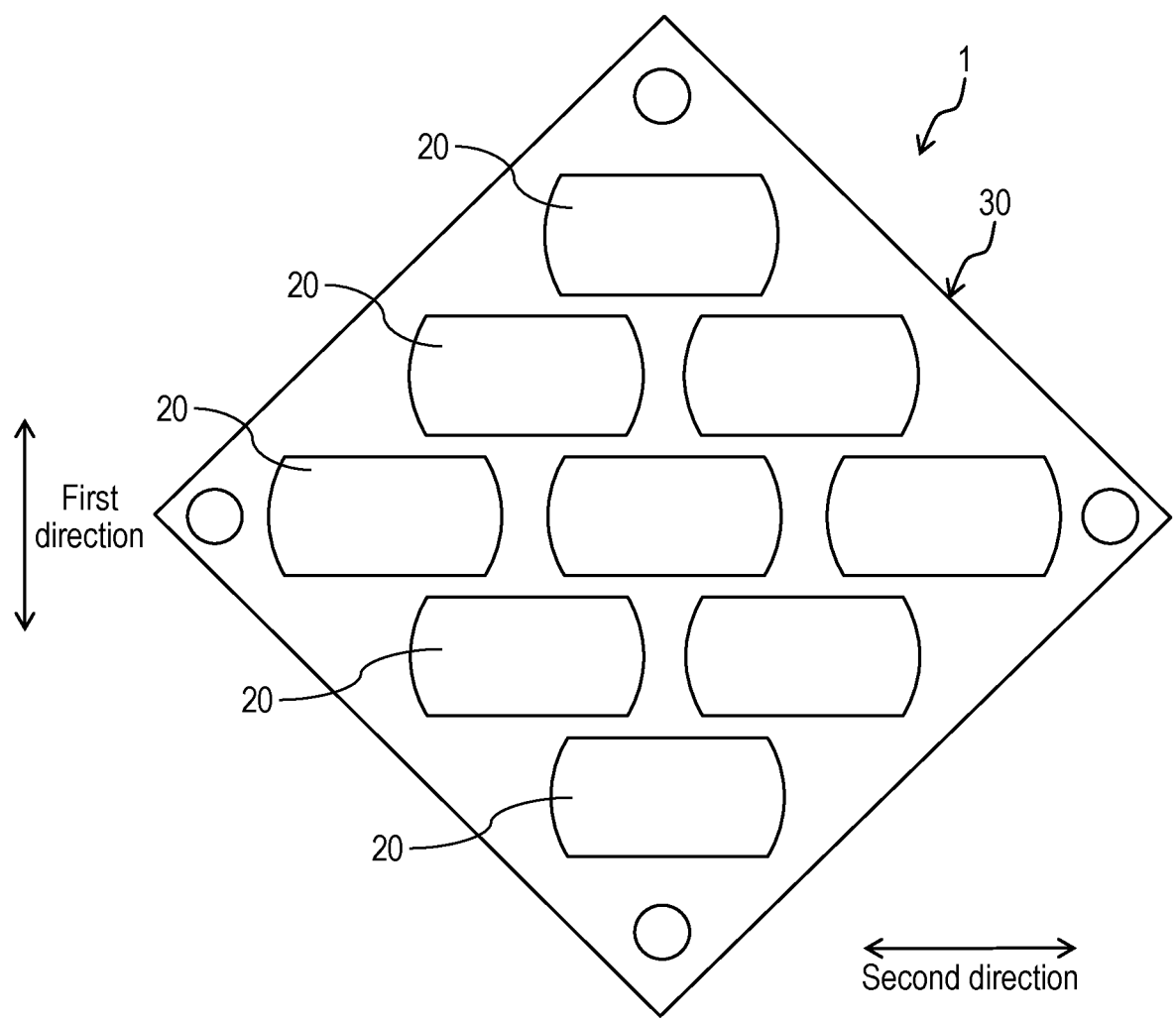
FIG. 27 is an external view of the planar shape of a light source device according to another exemplary embodiment.
Figure 28:
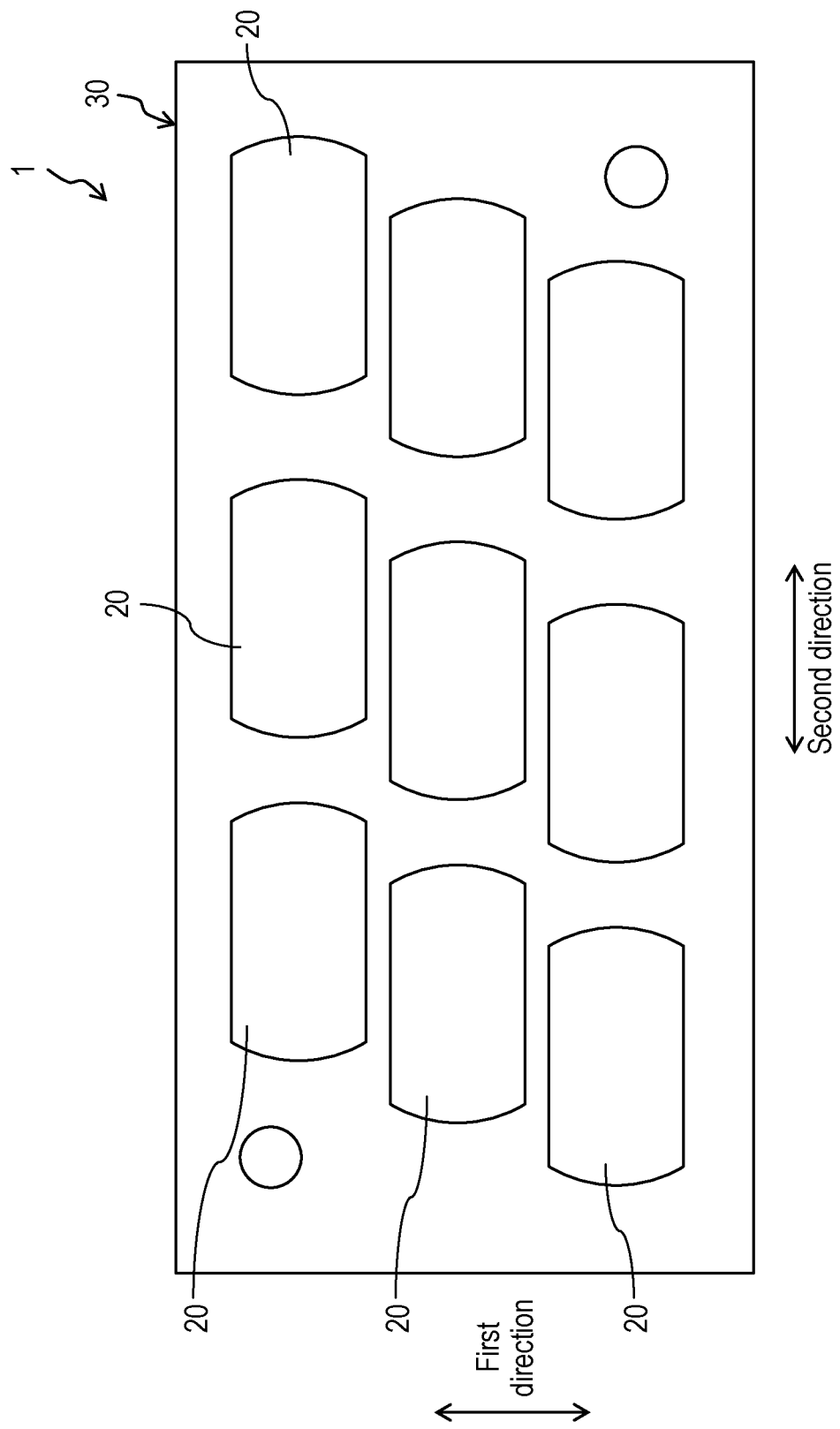
FIG. 28 is an external view of the planar shape of a light source device according to another exemplary embodiment.

(3) In the embodiments first to fourth, collimate lenses 20 of optical system 25 are disposed in a matrix (an example of a planar shape) of n rows by m columns. In an optical system of the present disclosure, however, collimate lenses 20 may be disposed in a matrix as well as in another planar shape. FIGS. 26 and 27 show an example where collimate lenses 20 are disposed in the first and second directions so that they are in a staggered arrangement. FIG. 28 shows an example where each position of collimate lenses 20 in the second direction is displaced by a given length in response to each position of the first direction.

(4) The first embodiment exemplifies the configuration in which lens holding member 30 has lens retaining springs 40, which prevents collimate lens 20 from dropping off lens holding member 30. However, instead of using lens retaining springs 40, collimate lens 20 may be fixed to lens holding member 30 with an adhesive, for example, to prevent collimate lens 20 from dropping off lens holding member 30.

(5) The fifth embodiment exemplifies the case where a light source device of the present disclosure is applied to a projector. Besides, a light source device of the present disclosure is applicable to a lighting device that illuminates an object and a lighting device for a monitoring camera, for example.

(6) The embodiments first to fourth exemplify the case where the lenses of an optical system are collimate lenses 20. In the present disclosure, however, the lenses of an optical system may be of any type as long as they converge (including collimate) light (laser rays) emitted from a light source such as a semiconductor laser device.

(7) The embodiments first to fourth exemplify the case where the light source is a laser light source. In the present disclosure, however, examples of a light source include various types of light sources besides a semiconductor laser device, such as an LED (light emitting diode), fiber laser, and a fiber light source that emits light of a laser light source from fluorescent substance provided on the tip of an optical fiber. These light sources are used as a group light source composed of multiple light sources.

All of the descriptions provide some exemplary embodiments and others that are supposed to be the best mode using the accompanying drawings and detailed descriptions. These are provided to those skilled in the art to exemplify the subjects described in the claims by referring to specific embodiments. Hence, the embodiments may undergo various kinds of change, substitution, addition, and/or omission within the scope of the claims and their equivalent technology.

INDUSTRIAL APPLICABILITY

The present disclosure is widely applicable to an optical system including multiple lenses each of which converges laser rays emitted from multiple semiconductor laser devices and to a light source device including the optical system.

What is claimed is:

1. An optical system comprising:
a plurality of lenses each being configured to converge light emitted from a corresponding one of a plurality of light sources; and
a lens holding member holding the plurality of lenses,
wherein the plurality of lenses are disposed at least in a first direction,
wherein optical axes of the plurality of lenses are substantially parallel to one another,
wherein each of the plurality of lenses has a cut-off face such that each of the plurality of lenses, as viewed from a top, has a shape of a partial circle formed by cutting off part of a periphery of a first circle,
wherein cut-off faces of lenses adjacent to each other along the first direction of the plurality of lenses face each other,
wherein the lenses adjacent to each other along the first direction of the plurality of lenses have an interval between centers of the lenses that is smaller than a diameter of the first circle,
wherein the lens holding member has an outer surface including a plurality of lens arrangement holes, a corresponding one of the plurality of lenses being disposed in each of the lens arrangement holes,
wherein lens arrangement holes adjacent to each other in the first direction of the plurality of lens arrangement holes are linked together to form a linked hole,
wherein the linked hole, as viewed from a top, has a shape that represents at least part of a shape formed by disposing a plurality of second circles in the first direction, the second circles being partially overlapped, each of the second circles having a diameter larger than a diameter of the first circle by a predetermined amount,
wherein the lens holding member has a plurality of light passing-through holes between the plurality of lenses and the plurality of light sources, and has a plurality of air holes arranged such that one of the air holes is located between cut-off faces of each pair of the lenses adjacent to each other in the first direction, the air holes communicating with the light passing-through holes.

2. The optical system of claim 1, wherein light passing-through holes adjacent to each other in the first direction of the plurality of light passing-through holes communicate with each other.

3. The optical system of claim 1, wherein the lens holding member is comprised of brass.

4. The optical system of claim 1, wherein the lens holding member has a plurality of lens retaining springs each of the lens retaining springs being configured to press a corresponding one of the plurality of lenses against an inside of a corresponding one of the plurality of lens arrangement holes.

5. The optical system of claim 1, wherein the partial circle has one of an I-shape and a D-shape formed by substituting a chord for an arc that is a part of the periphery of the first circle.

6. The optical system of claim 5, wherein, among the plurality of lenses, a lens disposed between a first lens at a first end and a second lens at a second end in the first direction, as viewed from the top, has the I-shape.

7. The optical system of claim 6, wherein the first lens at the first end in the first direction as viewed from the top, and the second lens at the second end as viewed from the top, has the D-shape.

8. The optical system of claim 5, wherein, among the plurality of lenses, the first lens at the first end and the second lens at the second end, in the first direction as viewed from the top, has the D-shape.

9. The optical system of claim 1, wherein each of the plurality of lenses is a collimate lens configured to collimate the light emitted from the plurality of light sources.

10. The optical system of claim 1, wherein the plurality of lenses is disposed in a matrix.

11. A light source device comprising:
the optical system of claim 1; and
the plurality of light sources each configured to emit the light to a corresponding one of the plurality of lenses.

12. The light source device of claim 11, wherein the light source is configured such that a cross-sectional shape of the light emitted from each of the plurality of light sources is an ellipse, the cross-sectional shape being perpendicular to the optical axis, and wherein the shape of each of the plurality of lenses, as viewed from the top, is larger than the ellipse of the light passing through each of the plurality of lenses.

13. The light source device of claim 12, wherein the ellipse is defined by a minor axis parallel to the first direction and a major axis crossing the minor axis.

* * * * *